United States Patent
Kwok et al.

[11] Patent Number: 5,864,255
[45] Date of Patent: Jan. 26, 1999

[54] FOUR QUADRANT SQUARE LAW ANALOG MULTIPLIER USING FLOATING GATE MOS TRANSITIONS

[75] Inventors: Chee Yee Kwok, St. Ives; Hamid Reza Mehrvarz, Kingsford, both of Australia

[73] Assignee: Unisearch Limited, Kensington, Australia

[21] Appl. No.: 750,693

[22] PCT Filed: Jun. 20, 1995

[86] PCT No.: PCT/AU95/00360

§ 371 Date: Dec. 18, 1996

§ 102(e) Date: Dec. 18, 1996

[87] PCT Pub. No.: WO95/35548

PCT Pub. Date: Dec. 28, 1995

[30] Foreign Application Priority Data

Jun. 20, 1994 [AU] Australia ................................ PM6364
Sep. 1, 1994 [AU] Australia ................................ PM7829
Dec. 23, 1994 [AU] Australia ................................ PN0280

[51] Int. Cl.$^6$ .................................................... G06F 7/44
[52] U.S. Cl. .......................... 327/359; 327/120; 455/333
[58] Field of Search .................................. 327/356–359, 327/116, 119–122; 455/326, 333

[56] References Cited

U.S. PATENT DOCUMENTS

| | | | |
|---|---|---|---|
| 3,956,643 | 5/1976 | Hite .......................................... | 327/357 |
| 4,751,744 | 6/1988 | Pavio, Jr. ................................. | 455/333 |
| 5,107,150 | 4/1992 | Kimura ..................................... | 327/349 |
| 5,187,682 | 2/1993 | Kimura ..................................... | 364/841 |
| 5,448,197 | 9/1995 | Sagawa et al. ........................... | 327/408 |
| 5,559,457 | 9/1996 | Uda et al. ................................. | 327/116 |

*Primary Examiner*—Kenneth B. Wells
*Attorney, Agent, or Firm*—Christie, Parker & Hale, LLP

[57] ABSTRACT

A four quadrant multiplier using multiple input floating-gate MOS transistors is provided. It is based on the square law characteristics of the MOS transistor and can be realised with only four floating gate MOS transistors, two resistors and a current source. The four floating gate transistors are configured with their sources connected in common and biased by a single current source. Output is taken between two common drain connections. Each transistor has three control gates with two being provided for selected ones of the two input signals and one for a biasing signal (optional). Input signals can be connected to the control gates in either a differential or single ended configuration. In one application, a programmable synaptic cell for neural networks employs the multi-input floating-gate MOS four-quadrant analog multiplier. Varying of the neural weight connection strength of each synaptic cell is achieved by two possible methods. One method involves programming charges into or out of the primary floating-gate of the MFMOS devices associated with the multiplier. The other method is to configure the third input gate of each MFMOS device of the multiplier as another (secondary) floating-gate structure whereby charge can be programmed into or out of this secondary floating-gate structure and its coupling area to the primary floating-gate would determine the neural weight. The differential output current is proportional to the product of the input signal and the programmed charge difference. In a natural extension an array of individually programmable synaptic cells form a neural network.

23 Claims, 27 Drawing Sheets

(a) $\Delta W \neq 0$, $\Delta W' = \Delta W'' = 0$
(b) $\Delta W' \neq 0$, $\Delta W = \Delta W'' = 0$
(c) $\Delta W'' \neq 0$, $\Delta W = \Delta W' = 0$

FOUR QUADRANT SQUARE LAW ANALOG MULTIPLIER USING FLOATING GATE MOS TRANSITIONS

I. INTRODUCTION

The present invention relates to the field of analog signal processing and in particular the invention provides a novel four quadrant analog multiplier which makes use of floating-gate MOS technology. The invention also provides an improved programmable synaptic cell employing the four-quadrant analog multiplier of the invention.

It is known in the prior art to construct multiplier circuits using bipolar technology. These prior art devices generally had limited input voltage swing range.

Researchers have also proposed MOS four quadrant analog multipliers based on conventional MOS technology, however these devices are limited in the input signal swing that they will tolerate before significant distortion sets in. Typically these prior art devices cannot accept input levels beyond one half of the supply rail voltage.

Four-quadrant analog multipliers are very useful and important building blocks in many signal processing circuits like correlators, convolvers, adaptive filters, modulation detection, frequency translation, neural networks and etc. So far, several analog multipliers designed in MOS technology based on the modified Gilbert cell (J. N. Babanezhad and G. C. Temes, "A 20-V four-quadrant CMOS analog multiplier," IEEE J. Solid-State Circuits, vol. SC-20, no. 6, pp. 1158–1168, December 1985; S. C. Qin and R. L. Geiger, "A ±5-V CMOS analog multiplier," IEEE J. Solid-State Circuits, vol. SC-22, no. 6, pp. 1143–1146, December 1987; D. C. Soo and R. G. Meyer, "A four-quadrant NMOS analog multiplier," IEEE J. Solid-State Circuits, vol. SC-17, no. 6, pp. 1174–1178, December 1982), and the square-law characteristic of the MOS have been reported (K. Bult and H. Wallinga, "A CMOS four-quadrant analog multiplier," IEEE J. Solid-State Circuits, vol. SC-21, no. 3 pp. 430–435, June 1986; J. Pena-Finol and J. A. Connelly, "A MOS four-quadrant analog multiplier using the quarter-square technique," IEEE J. Solid-State Circuits. vol. SC-22, no. 6, pp. 1064–1073, December 1973; H. G. Song and C. K. Kim, "A MOS four-quadrant analog multiplier using simple two-input squaring circuits with source followers," IEEE J. Solid-State Circuits. vol. 25, no. 3 June 1990; Z. Wang, "A CMOS four-quadrant analog multiplier with single-ended voltage output and improved temperature performance," IEEE J. Solid-State Circuits, vol. 26, no. 9, September 1991). The variable transconductance technique based on the Gilbert six transistors cell (GSTC) is very popular and useful in bipolar technology since the output current of a bipolar GSTC has a linear relationship with the tail current source which allows for the nonlinear relationship with the input signals, $V_x$ and $V_y$, to be compensated simply by using an appropriate predistortion circuit (P. R. Gray and R. G. Meyer, "Analysis and design of analog integrated circuits, 2nd ed. New York: Wiley, 1984, pp. 593–605). However, the output current of a MOS transistor multiplier based on the GSTC has a nonlinear relationship with tail current source and input signals which makes compensation relatively difficult. By contrast, the square-law based MOS multiplier can be implemented easily because of the inherent square law characteristics of the MOS transistor in the saturation region. PENA-FINOL et.al. have reported a four quadrant analog multiplier based on the quarter-square algebraic identity. Its circuit configuration is relatively complicated and is designed in three stages. In the first stage, the sum and differences of the two input signals are obtained. Then these results are squared in the second stage and the difference of squares is extracted in the third stage. At input signal levels equal to 50% of the supply voltage, 0.73% total harmonic distortion and 0.44% nonlinearity were reported. The multiplier proposed by SONG et.al. is also based on the subtraction of the sum-squared and difference-squared of two input signals. To achieve the squaring of the sum or difference of two inputs, one input is applied to the gate whilst the other one is applied to the source through a source follower with a ( W/L ) ratio much larger than that of the squaring transistor such that the gate-to-source voltage drop of the source follower could be regarded as nearly constant. THD and nonlinearity of 0.6% and 0.45% respectively were achieved at input signal levels equivalent to 40% of supply voltage. Recently an all-MOS analog multiplier reported by WANG achieved nonlinearity of 1% at input signal levels of half the supply voltage range. This multiplier used the linear MOS transconductor which requires floating voltage input, generated from a scaled floating-voltage generator.

One application for analog multipliers is in the emulation of neural functions. There are approximately $10^{11}$ neurons and $10^{14}$ synapses in the human cerebral cortex, operating with a very high degree of parallelism, which give humans their cognitive capabilities. The technologies that aim to mimic these human capabilities would need to fabricate a very large number of neurons and synapses. In addition, they need to be able to program the synaptic strengths because these strengths or "weights" contain the information that controls the function of the neural network.

In recent years, much effort has been directed towards emulating the neural functions like learning and recognition by means of VLSI analog CMOS circuit implementation of Artificial Neural Network. A neuron consist of a neuron body, the synapse which modulates its inputs and the axons which distributes its output to other neurons. The key computational components in a analog neural synaptic cell and neurons are four quadrant multipliers and summers. Each synaptic cell provides a weighted electrical connection between an input and a summing element, that is, the neuron body.

For learning within an associative network to be possible, each synaptic cell must have adaptive weight values since a trainable network system cycles through a series of weight changes until the entire network converges to a certain pattern which depends upon the pattern of inputs applied. Hence the ability of a synaptic cell to store and vary the weight is crucial to its operation.

Several circuits involving the use of four quadrant multipliers in synaptic cells have been proposed. A particular known prior art (U.S. Pat. No. 4,950,917) refers to a programmable synaptic cell employing a simplified Gilbert four quadrant multiplier is shown in FIG. 19. The charge stored in EEPROM devices 114 and 115 will determine the amount of current that would flow into the differential pairs of the multiplier. In fact, the difference in floating-gate charge of devices 114 and 115 is the analog multiplication factor (i.e. the neural weighting factor). Another prior art device, shown in FIG. 20 (U.S. Pat. No. 4,956,564), consist of a floating-gate transistor where the amount of charge in the floating-gate determines the drain current. The neural weight is the amount of charge stored in the floating-gate (201). When a binary voltage pulse having a certain duration is applied to the control gate 200 of device 210, a current is generated which acts to discharge the capacitance associated with the summing line 220. The resulting charge removed from the capacitor 231 is directly proportional to the product of the charge stored in the floating-gate (201) and the duration of the input pulse. In order to achieve both excitatory as well as inhibitory functions, four quadrant multiplication is needed and this is achieved by using four similar floating gate devices, 210–213, with differential input and output lines as shown in FIG. 20.

II. SUMMARY OF THE INVENTION

According to a first aspect, the present invention consists in an analog multiplier circuit including at least four Multiple-input Floating-gate MOS (MFMOS) transistors connected in a common source configuration.

Throughout this specification the term "common source configuration" is intended only to indicate a configuration in which the sources of the relevant transistors are connected to each other.

Preferably the analog multiplier of the present invention will be implemented as a four quadrant, square law multiplier.

This would typically be achieved by grouping four of the at least four transistors as a first pair of transistors and a second pair of transistors with each pair having their drains connected together and connected to a voltage supply via a load.

The common source connection of the common source configuration is preferably connected to a current source.

In the configuration of the preferred embodiment the multiplier circuit has an output defined as the difference in voltage between the respective common drain connections of the first pair and the second pair of transistors and would have first and second input signals to be multiplied together connected to selected first and second control gates of each transistor so as to achieve either a floating or single ended input configuration arranged to accept floating or non-floating differential inputs or single ended inputs respectively. In this arrangement the first input signal would typically be connected between first control gates on respective ones of the first pair of transistors as well as between first control gates on respective ones of the second pair of transistors, and said second input signal, to be multiplied with the first input signal would be connected with a first polarity relative to the first input signal between second control gates on respective ones of the first pair of transistors and would be connected with opposite polarity relative to the first input signal between the second control gates on the second pair of transistors.

In one embodiment of the invention all of the inputs are floating with respect to one another in the absence of input signals, whereas in a second embodiment one of the first control gates and one of the second control gates of each transistor pair is connected to a signal reference point.

In particular, the second embodiment has the first input signal connected with reference to a common reference to a second control gate of one transistor in the first pair of transistors and to a second control gate of one transistor in said second pair of transistors, whereas the second input signal is connected with reference to the common reference to a first control gate of said one transistor in the first pair of transistors and to a first control gate of a second transistor in the second pair of transistors and the common reference is connected to the first control gate and the second control gate of a second transistor in said one pair of transistors, to the first control gate of a first transistor in the second pair of transistors and to the second control gate of the second transistor in said second pair of transistors.

Third control gates are preferably provided on each transistor in the preferred embodiment, a bias voltage being applied to each of the third control gates so as to fine tune the biasing conditions for optimal performance of said circuit.

In further embodiments of the invention multiplier circuits are provided which are adapted to multiply more than two input signals together.

In the preferred embodiment of the invention each of the transistors is implemented as a floating gate MOS device on a common substrate and preferably as a long channel floating gate MOS device.

In the preferred embodiment the floating gates are in the form of a first polysilicon layer and the control gates are in the form of a second polysilicon layer.

In one advantageous form of the invention, each of the at least four transistors is laid out such that the floating gate (first polysilicon layer) over the channel extends into the field region where it capacitively couples to the control gates.

Preferably, embodiments of the invention are implemented in a configuration to minimise mismatches which can degrade total harmonic distortion performance and/or linearity performance. In one form of the invention this is achieved by laying out the device with four of said at least four transistors grouped as a first pair of transistors M1, M2 and a second pair of transistors M3, M4 and arranged so that either (i) the control gates of M1 are close to the control gates of M4 and the control gates of M2 are close to the control gates of M3 or (ii) the control gates of M1 are close to the control gates of M3 and the control gates of M2 are close to the control gates of M4 in order to achieve the smallest value of $\Delta W$ (where $\Delta W$ is defined in the specification).

According to a second aspect, the present invention provides in an analog multiplier circuit comprising at least four multiple-input floating-gate MOS (MFMOS) transistors connected in a common source configuration, a method of minimising production of second order harmonics, the method comprising implementing said at least four transistors on a common substrate wherein four of said at least four transistors are grouped as a first pair of transistors M1, M2 and a second pair of transistors M3, M4 arranged so that either (i) the control gates of M1 are close to the control gates of M4 and the control gates of M2 are close to the control gates of M3 or (ii) the control gates of M1 are close to the control gates of M3 and the control gates of M2 are close to the control gates of M4 in order to achieve the smallest value of $\Delta W$ (where $\Delta W$ is defined in the specification).

According to a fourth aspect the present invention consists in an analog multiplier comprising at least four multiple-input floating-gate MOS (MFMOS) transistors connected in a common source configuration, employing a method of minimising production of second order harmonics, the method including implementing said at least four transistors on a common substrate wherein four of the at least four transistors are grouped as a first pair of transistors M1, M2 and a second pair of transistors M3, M4 so arranged so that either (i) the control gates of M1 are close to the control gates of M4 and the control gates of M2 are close to the control gates of M3 or (ii) the control gates of M1 are close to the control gates of M3 and the control gates of M2 are close to the control gates of M4 in order to achieve the smallest value of ΔW (where ΔW is defined in the specification).

According to a third aspect, the present invention consists in a programmable synaptic cell including a four quadrant multiplier structure implemented using multiple input floating gate MOS (MFMOS) devices and having an input, an output and weighting means to apply a weight to said four quadrant multiplier structure whereby the output is proportional to the product of the weight and a voltage applied to the input.

In one embodiment of the invention, each MFMOS device of the multiplier structure includes a secondary input gate, the weighting means including each of the secondary input gates and the secondary gates being arranged as floating gates capable of storing a charge representing the weight.

Preferably in this embodiment the secondary floating input gate is connected to a thin oxide tunnelling structure configured as a charge injection structure.

In another embodiment the weighting means is provided by a weighting circuit incorporating a primary floating input gate of each of the MFMOS devices of the multiplier structure and the weighting circuit includes charging means which applies the weight to the multiplier as an electric charge stored on the primary floating gates.

Preferably in this embodiment the charging means includes thin oxide tunnelling structure arranged to inject charge into the primary gates.

According to a second aspect the present invention consists in an artificial neural network implemented from a selectively programmable and switchable array of programmable synaptic cells as described above.

III. BRIEF DESCRIPTION OF THE DRAWINGS

Embodiments of the invention will now be described in greater detail with reference to the following drawings in which:

FIG. 1(a) an illustration of the cross-section structure of a floating gate MOS transistor with three inputs;

Figure 4:
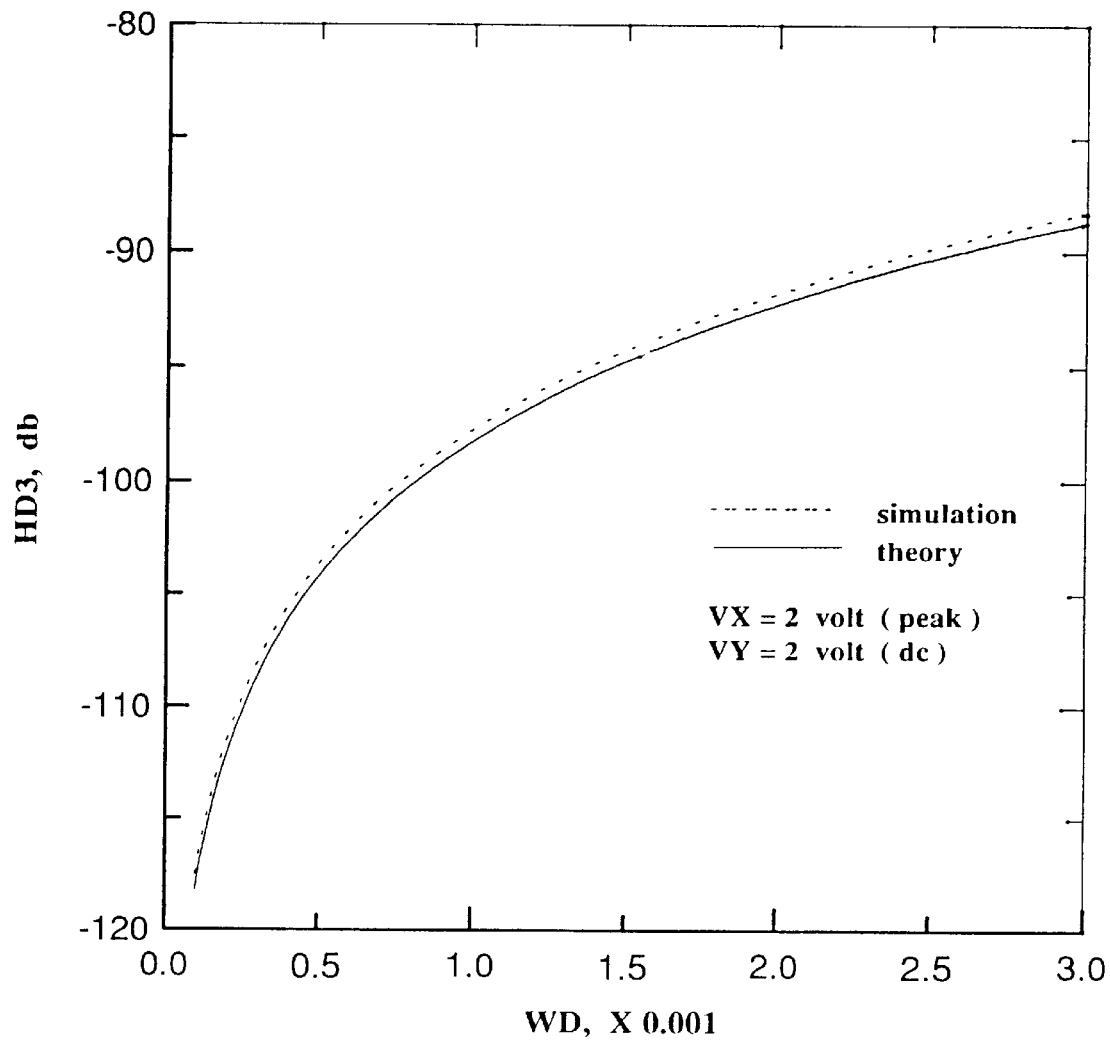
Figure 5:
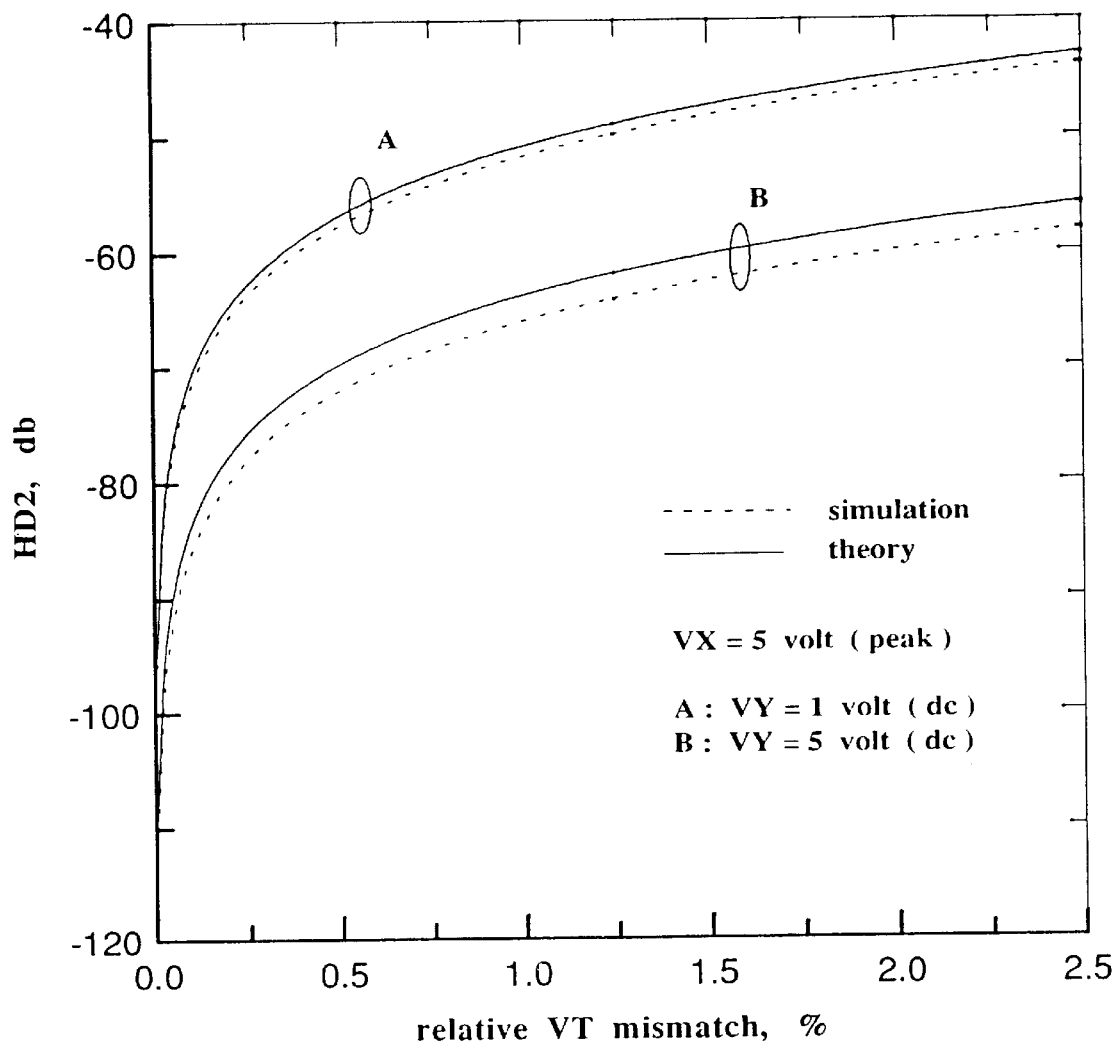
Figure 6:
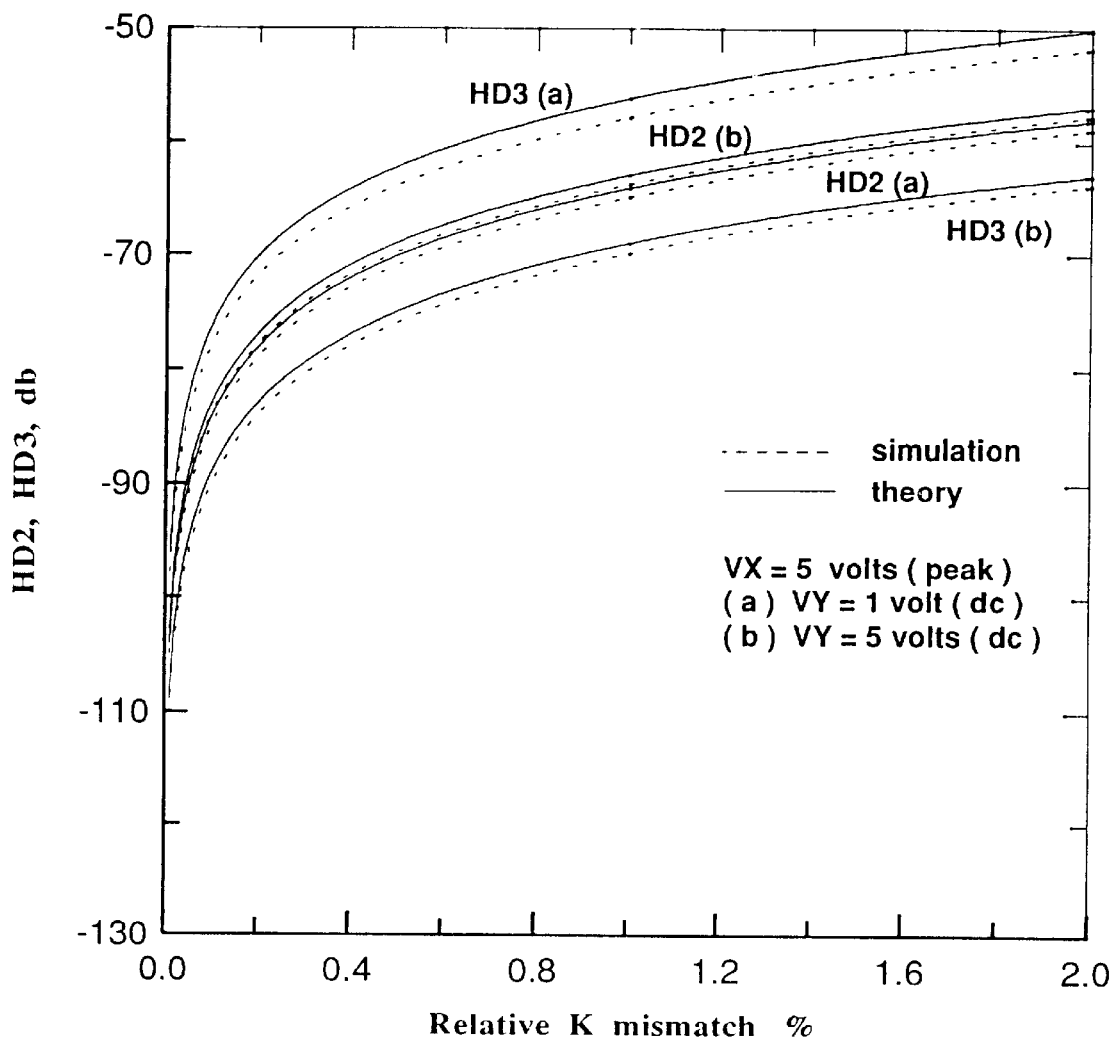
Figure 7:
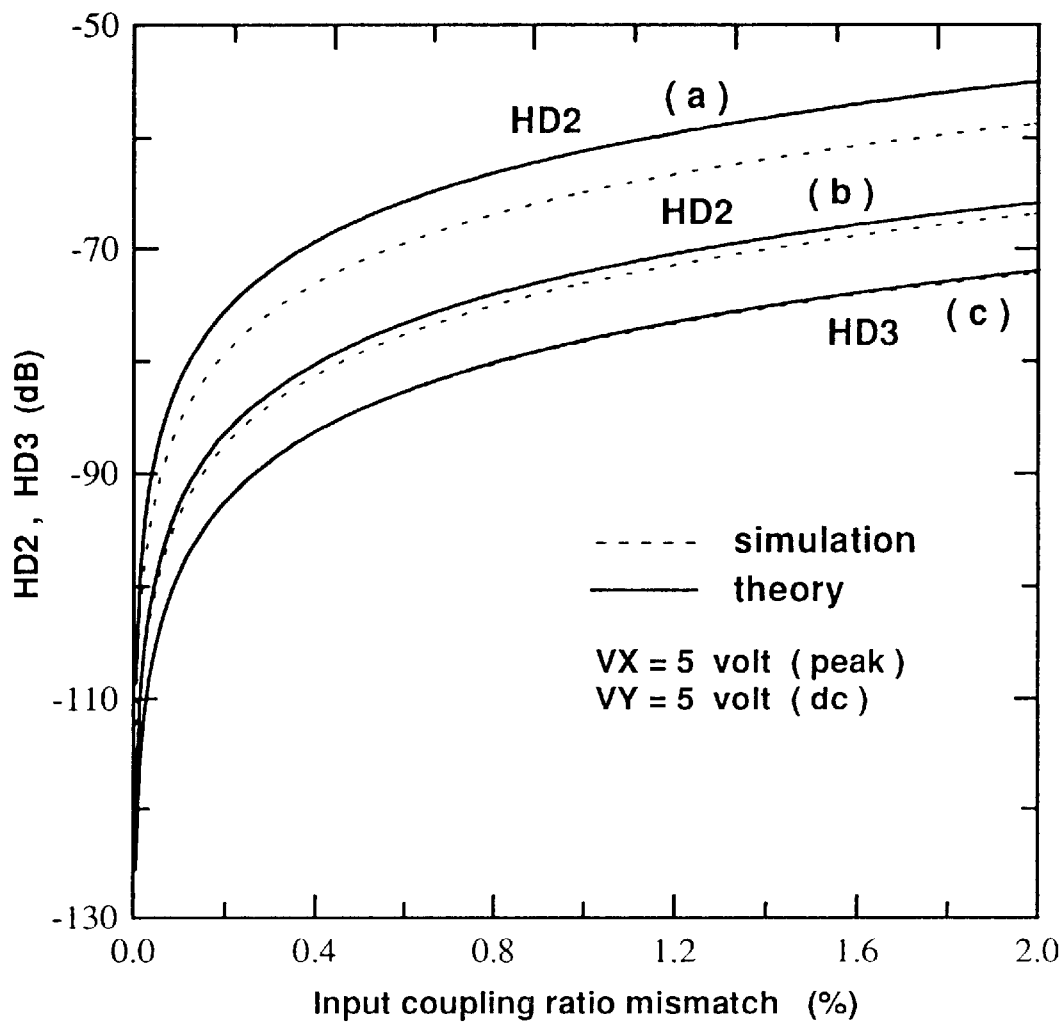

FIG. 4 graphically illustrates simulated results of distortion caused by overlap capacitance between gate and drain:

FIG. 5 graphically illustrates simulated results of distortion caused by threshold voltage mismatch:

FIG. 6 graphically illustrates simulated results of distortion due to K mismatch:

FIG. 7 graphically illustrates simulated results of distortion due to mismatch in input capacitive coupling ($V_y=5_v$, $V_x=5_v$ peak):
 (a)ΔW≠0, ΔW'=ΔW"=0
 (b)ΔW'≠0, ΔW=ΔW"=0
 (c)ΔW"≠0, ΔW=ΔW'=0

Figure 8:
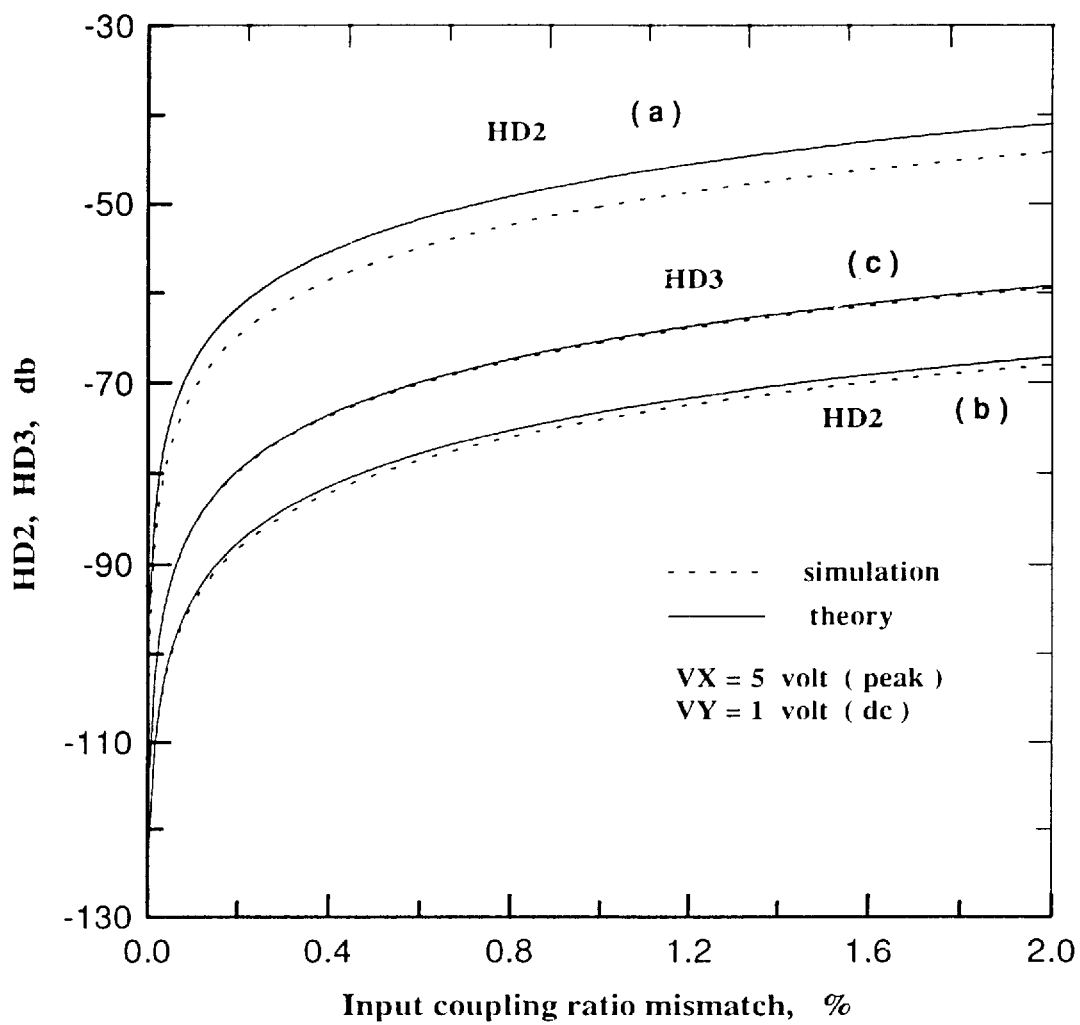

FIG. 8 graphically illustrates simulated results of distortion due to mismatch in input capacitive coupling ($V_y=1_v$, $V_x=5_v$ peak);
 (a)ΔW≠0, ΔW'=ΔW"=0
 (b)ΔW'≠0, ΔW=ΔW"=0
 (c)ΔW"≠0, ΔW=ΔW'=0

Figure 9:
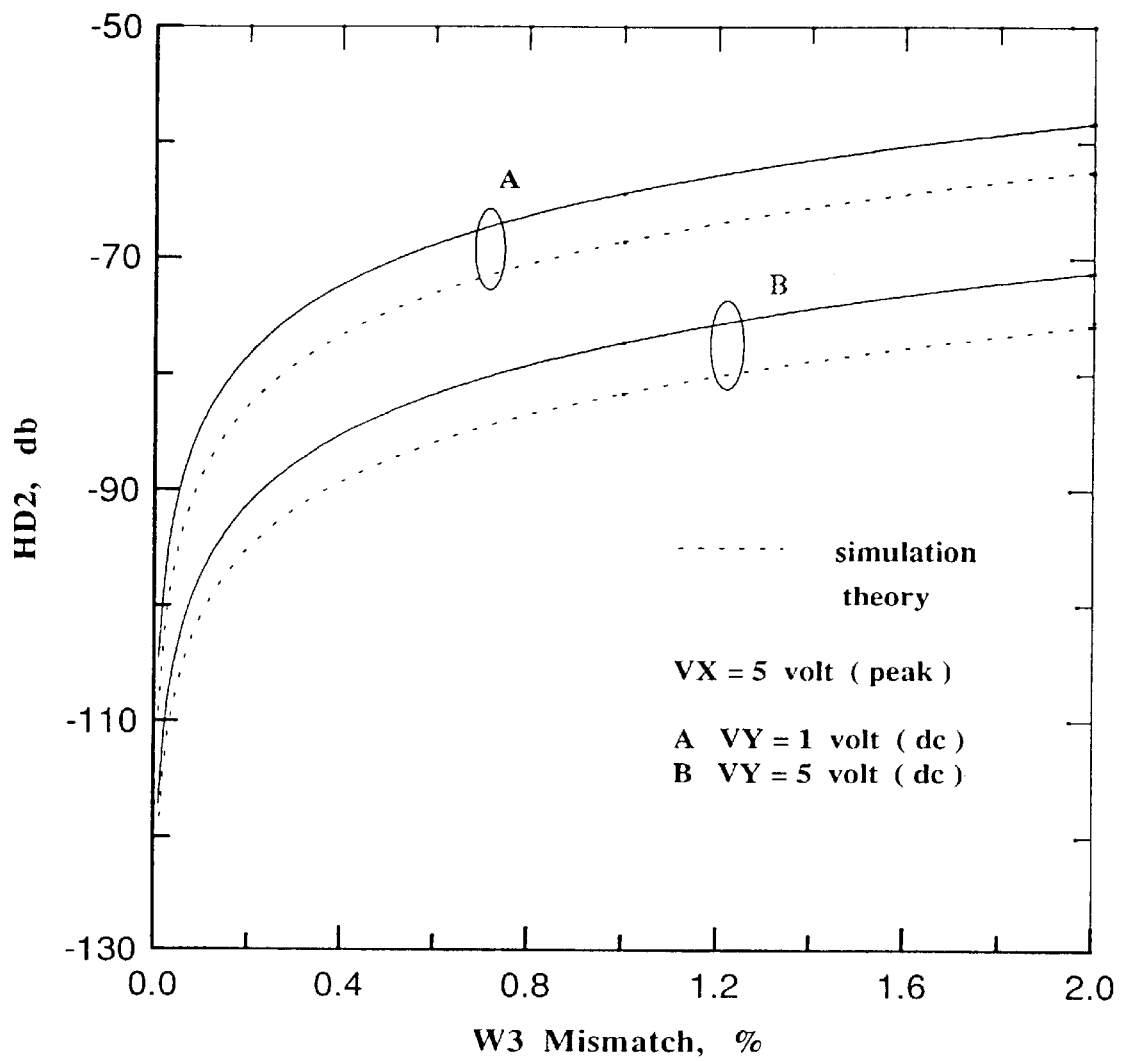
Figure 10:
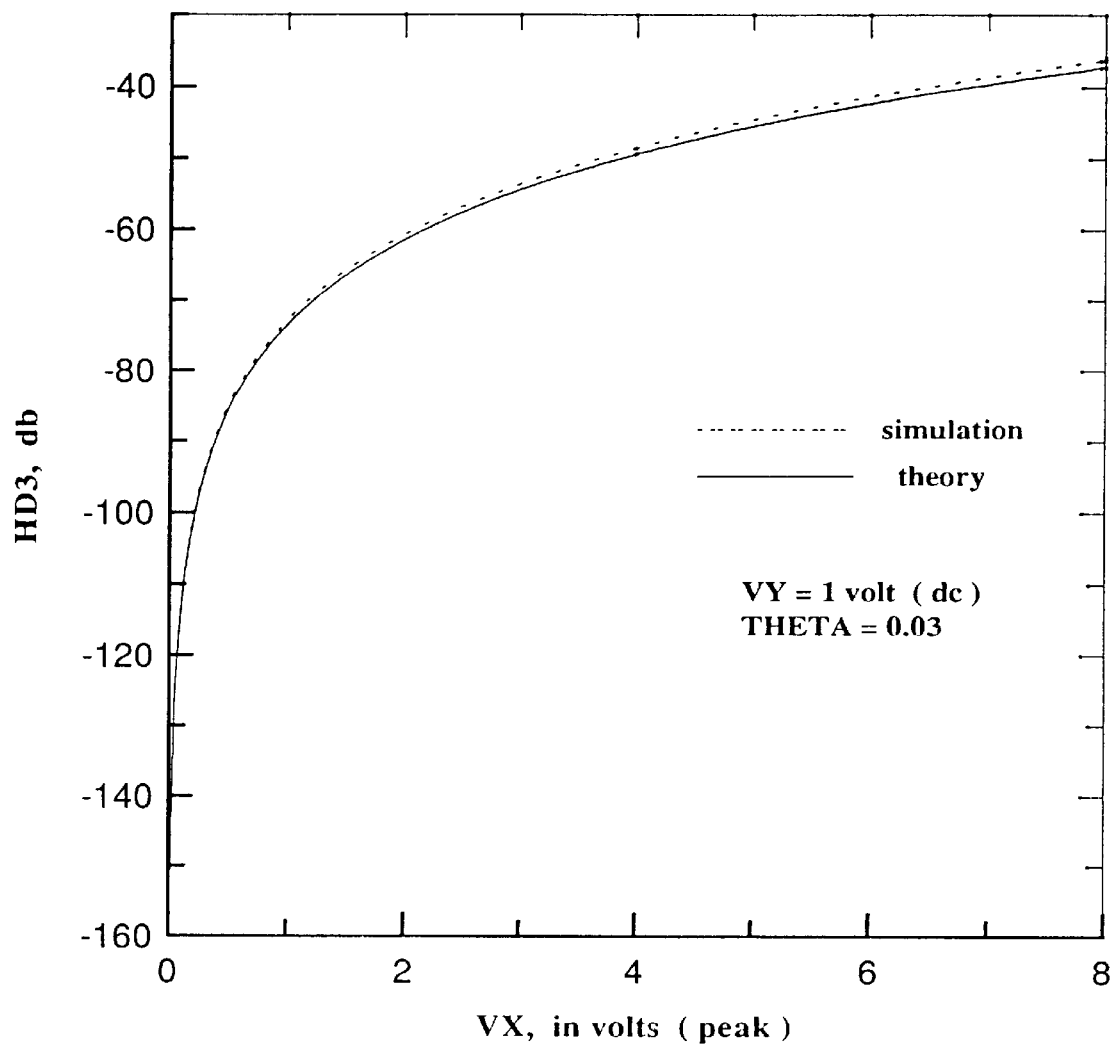
Figure 11:
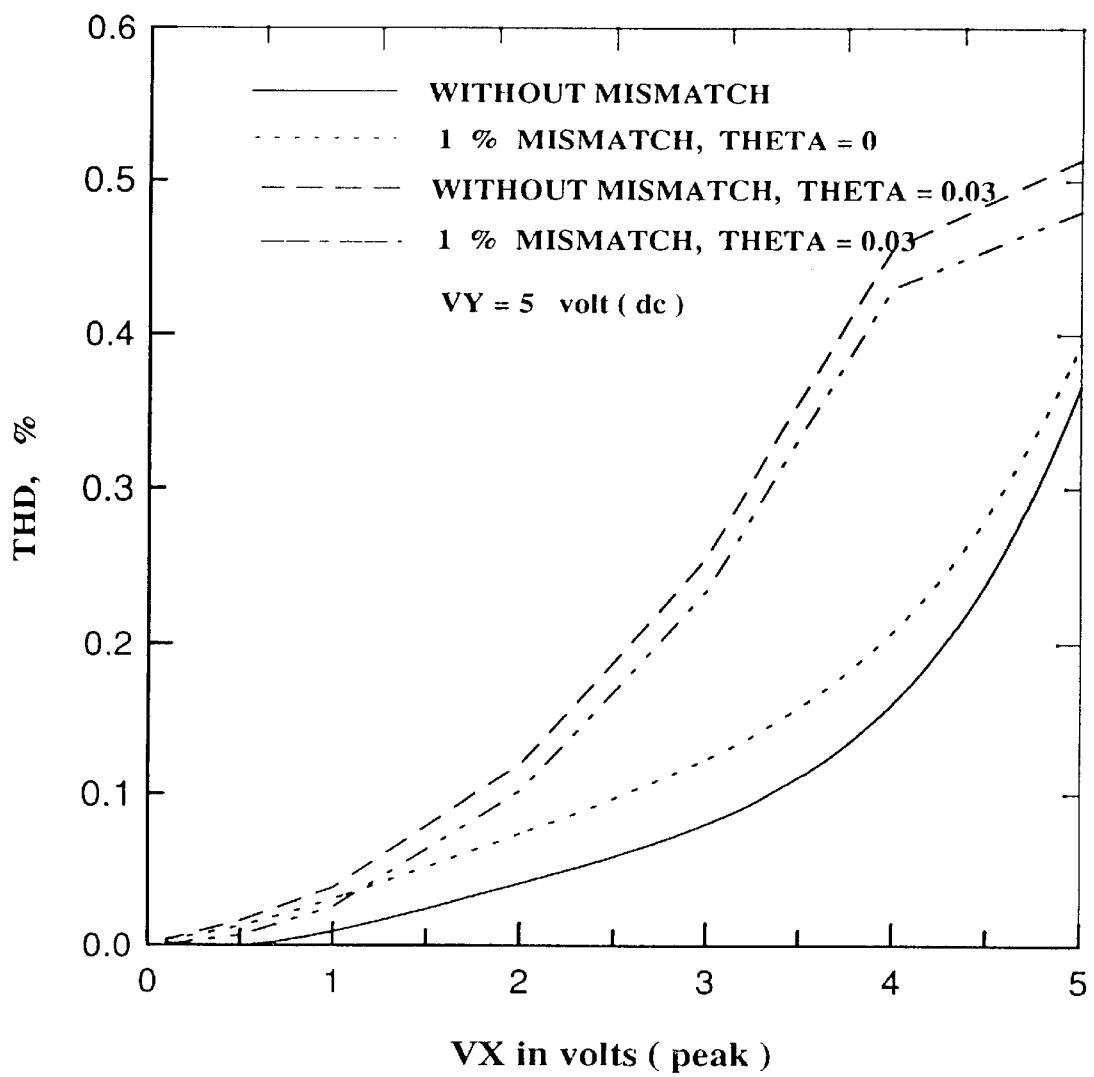
Figure 12:
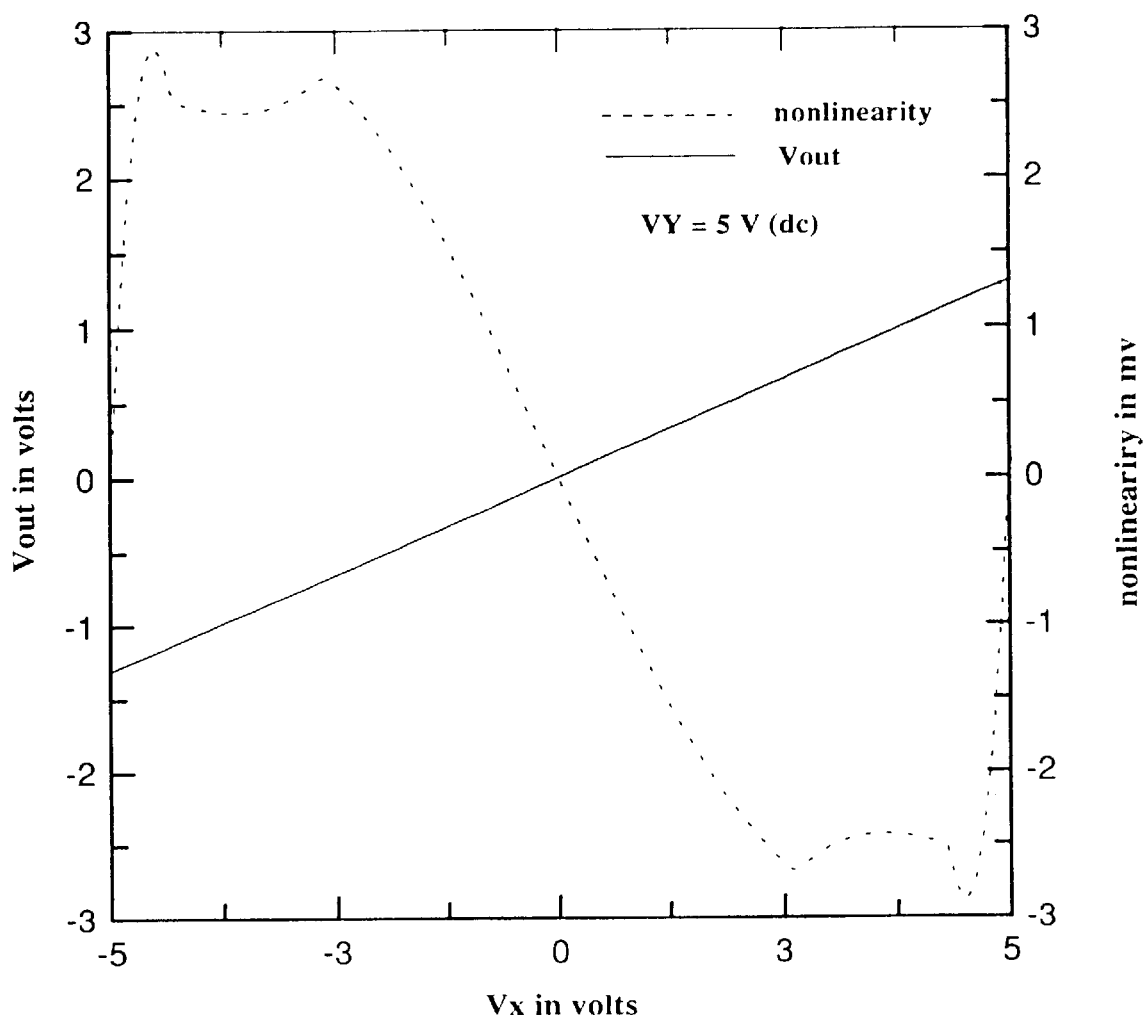
Figure 13:
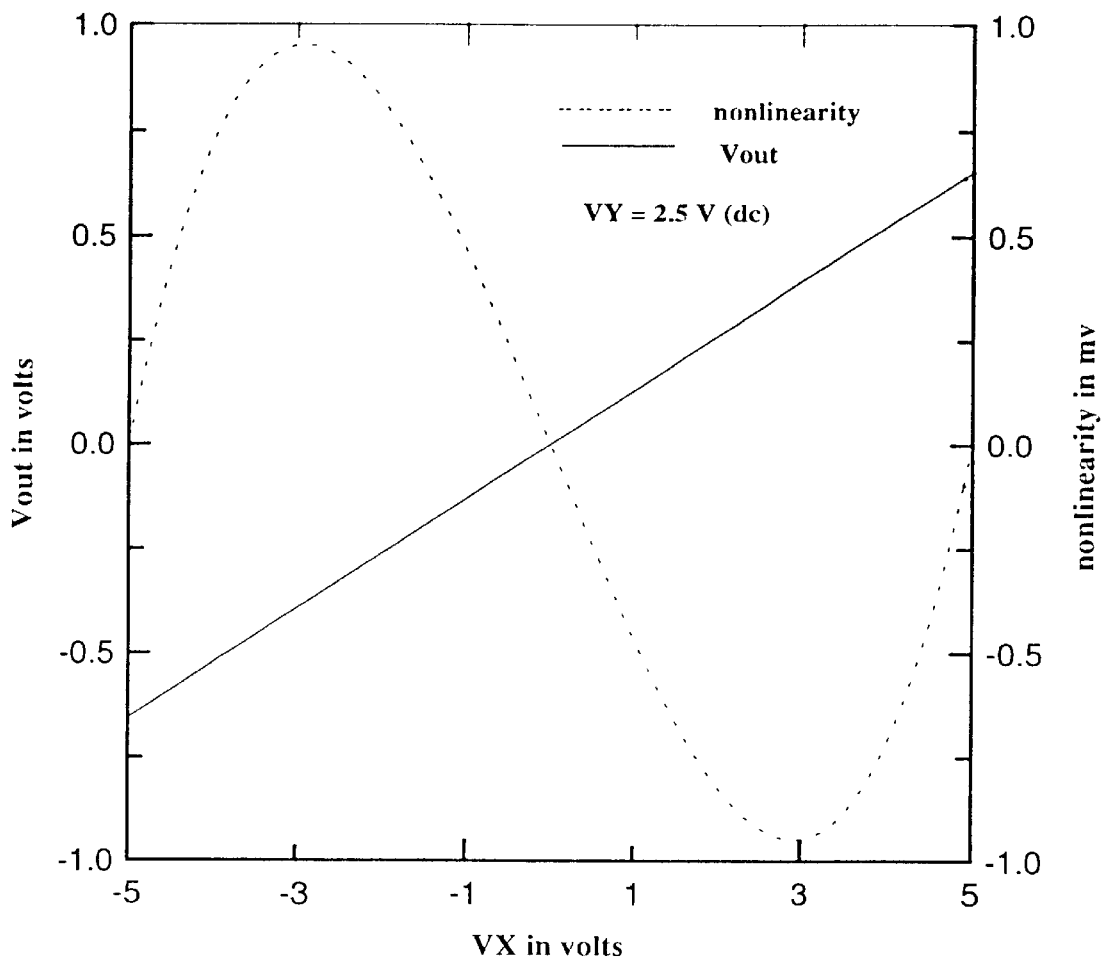
Figure 14:
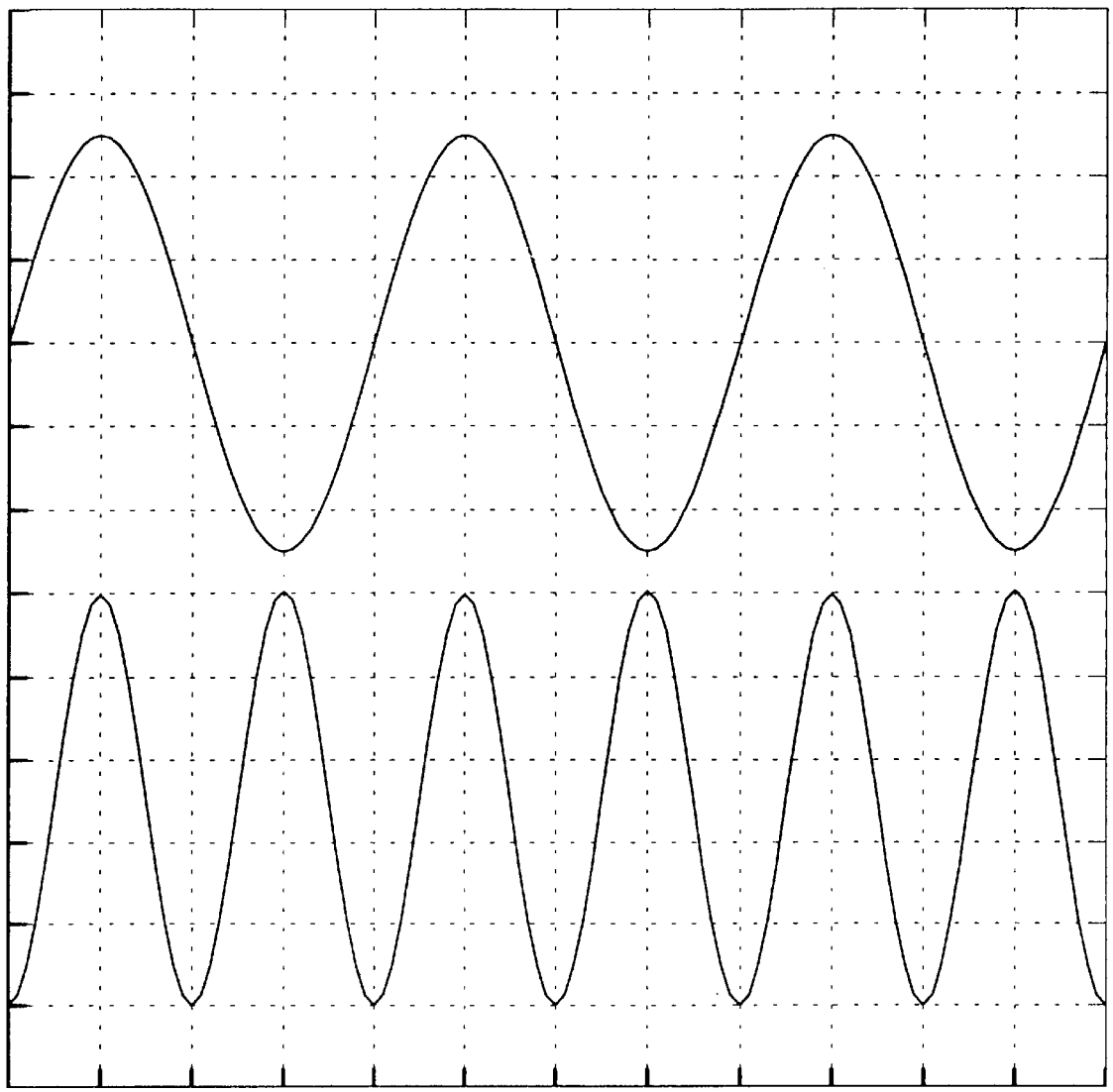
Figure 15:
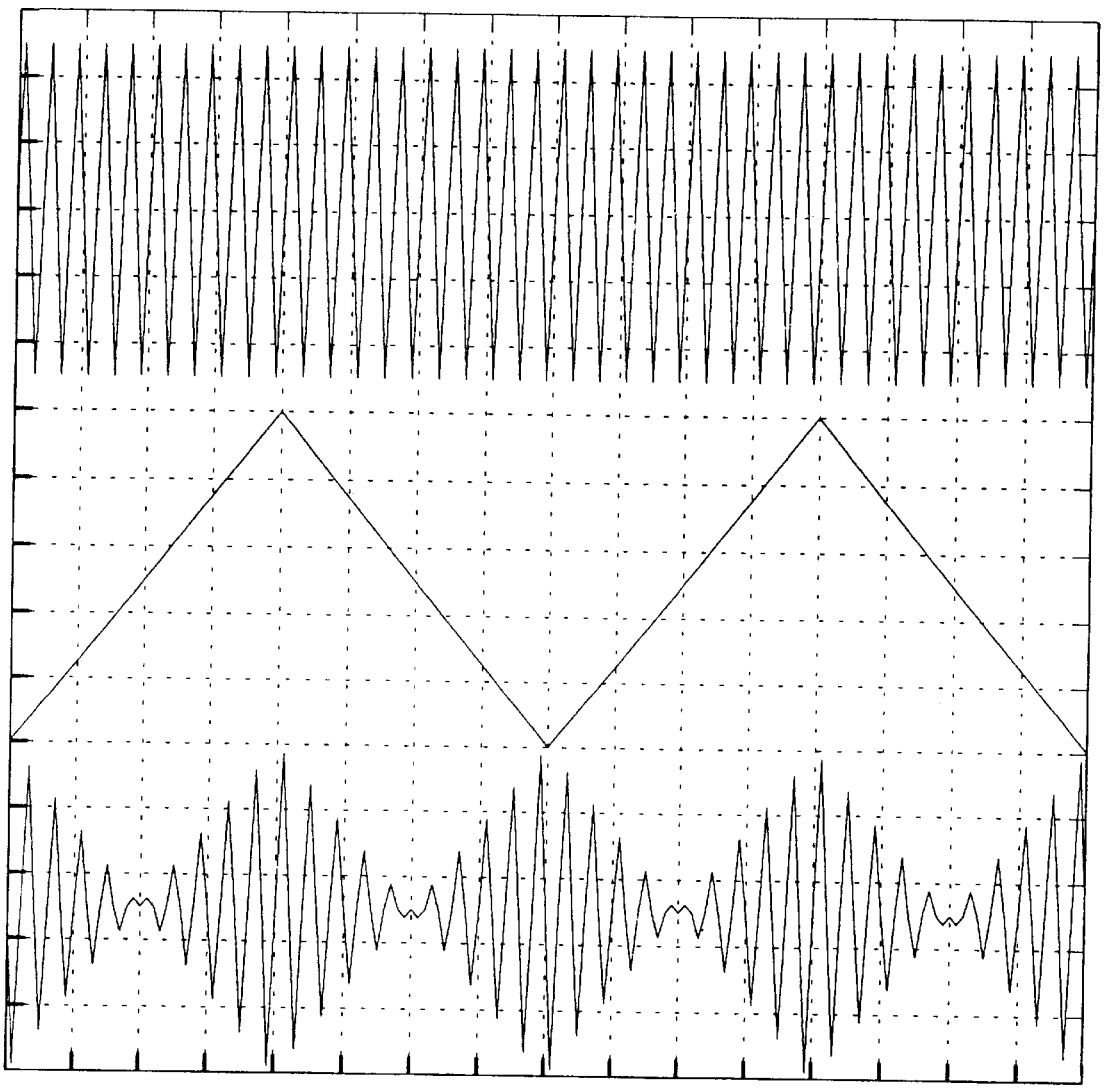
Figure 16:
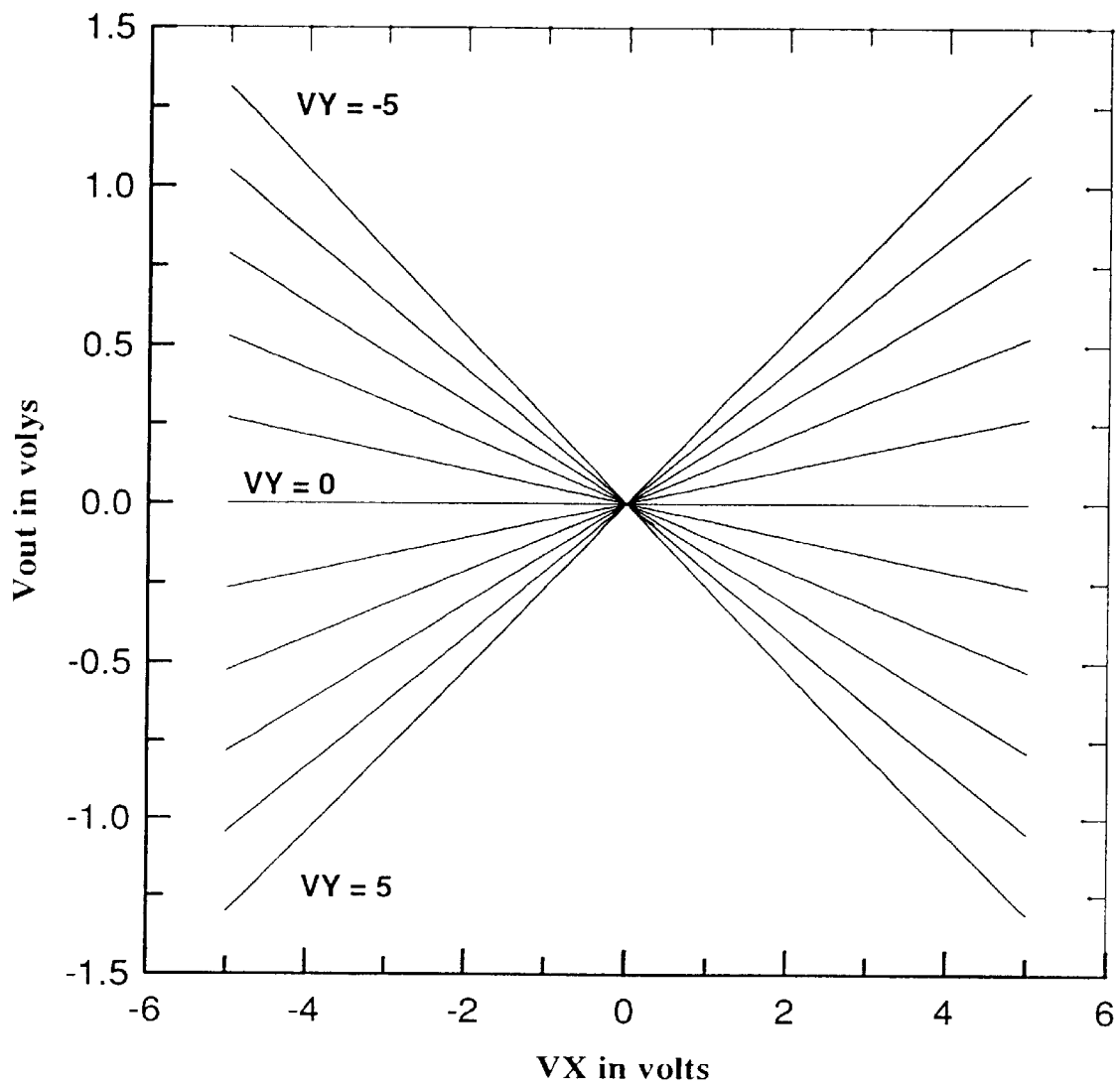
Figure 17:
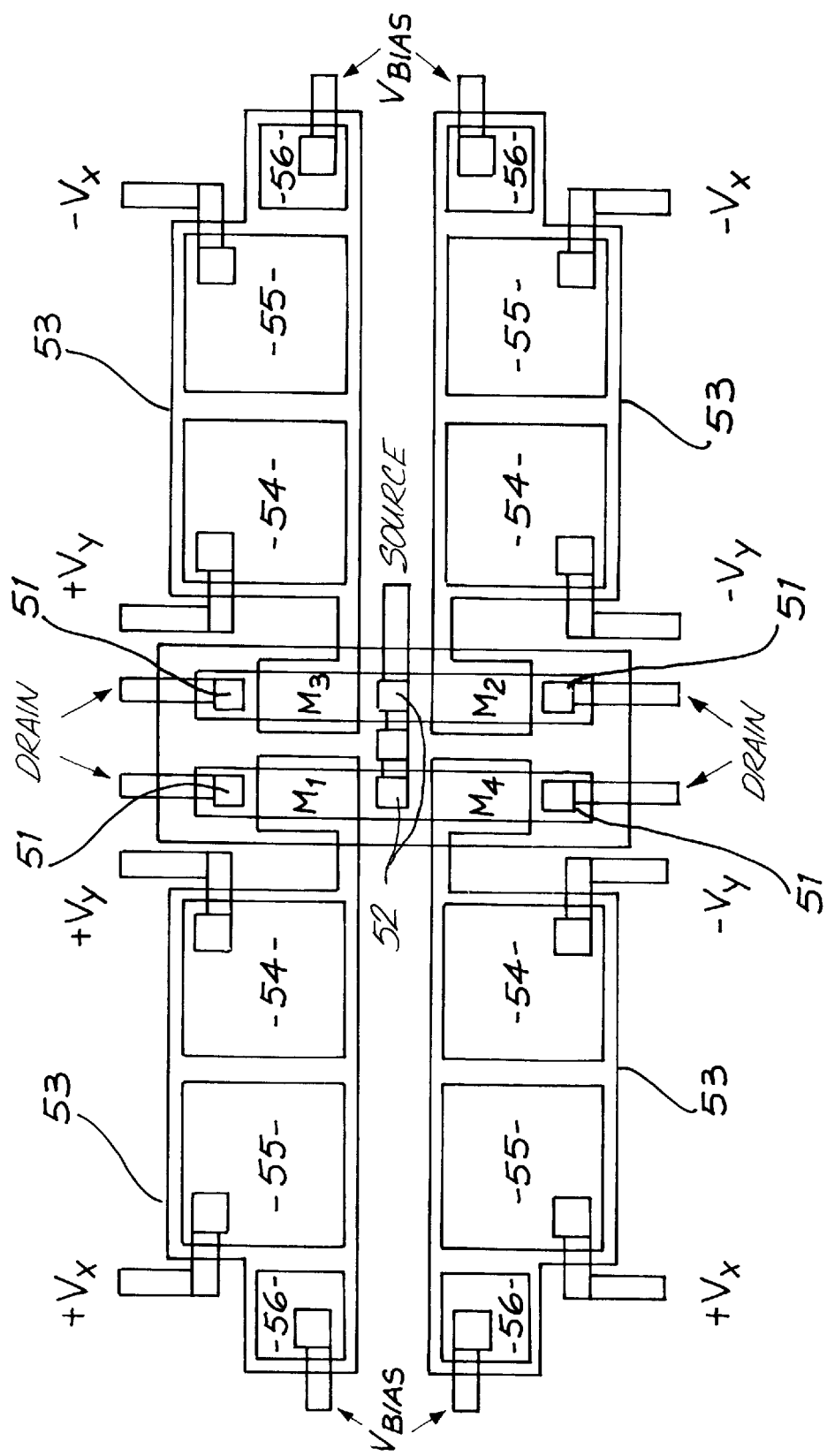
Figure 18A:
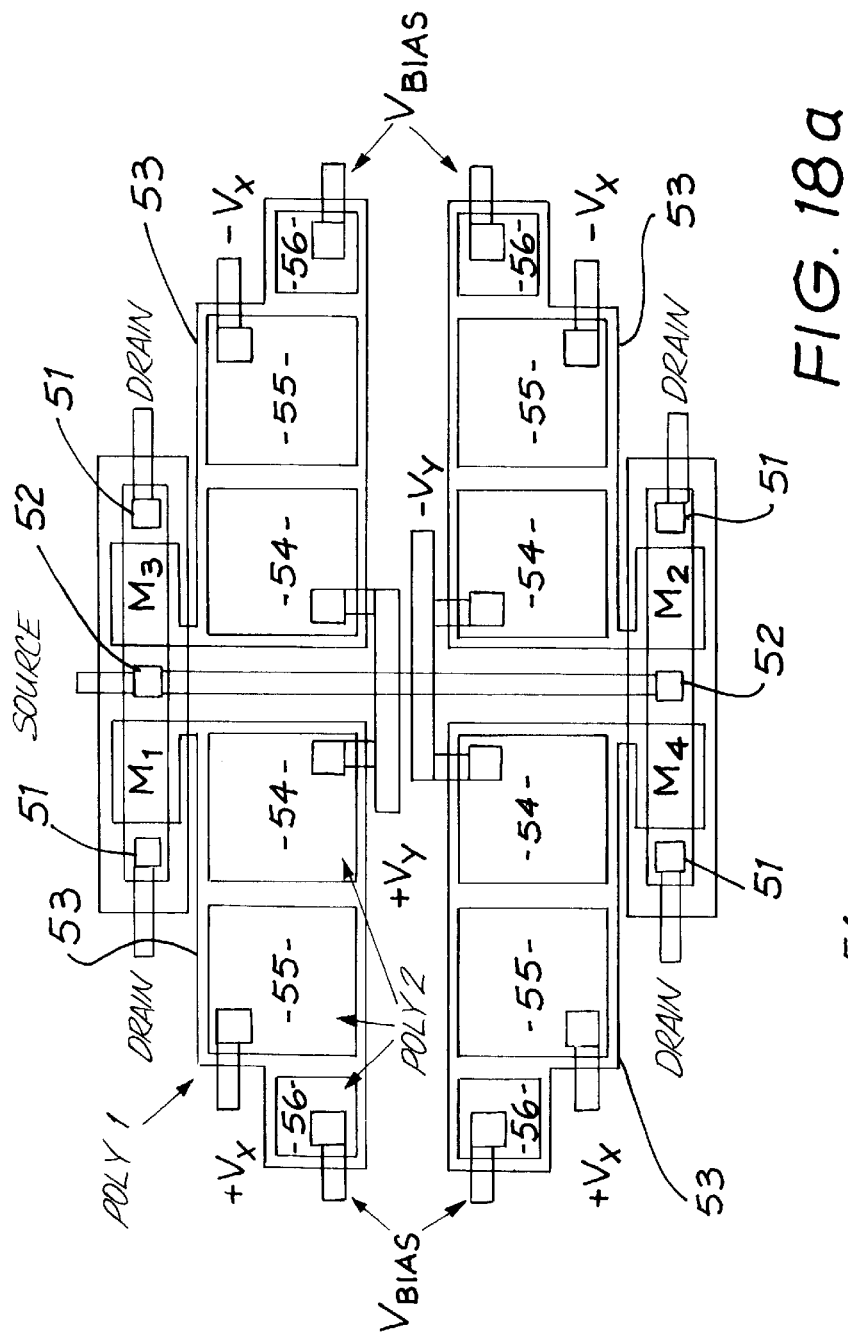

FIG. 9 graphically illustrates simulated results of distortion caused by mismatch in input capacitive coupling used for biasing;

FIG. 10 graphically illustrates simulated results of distortion due to mobility degradation;

FIG. 11 graphically illustrates simulated total harmonic distortion as a function of $V_x$;

FIG. 12 graphically illustrates simulated nonlinearity of the multiplier;

FIG. 13 graphically illustrates simulated nonlinearity of the multiplier;

FIG. 14 graphically illustrates simulated of multiplication of two 10-KHZ sine waves in-phase (upper trace, 2 V/div, and lower trace, 0.25 V/div);

FIG. 15 graphically illustrates simulated of the product of a 100-KHZ sine wave and a 5-KHZ triangular wave (the upper and medium traces, 2 V/div, and the lowest trace, 0.5 V/div);

FIG. 16 graphically illustrates simulated dc transfer characteristics of the multiplier where $V_y$ is a parameter changed from −5 V to +5 V;

FIG. 17 illustrates a first integrated circuit layout for an implementation of an embodiment of the present invention; and FIG. 18a illustrates a second integrated circuit layout for an implementation of a further embodiment of the invention.

Figure 18B:
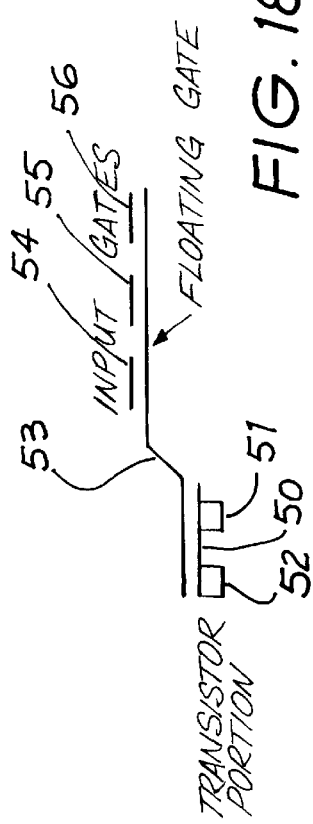

FIG. 18b illustrates a partial side view of the layout of FIG. 18a, showing the vertical configuration of one transistor.

Figure 19:
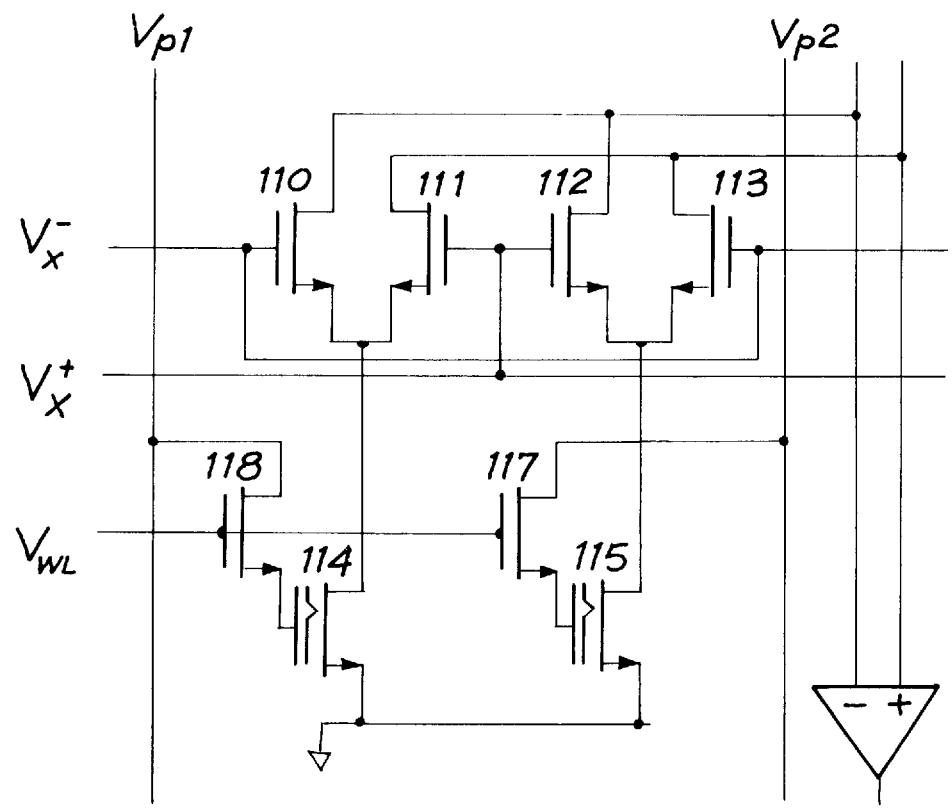
Figure 20:
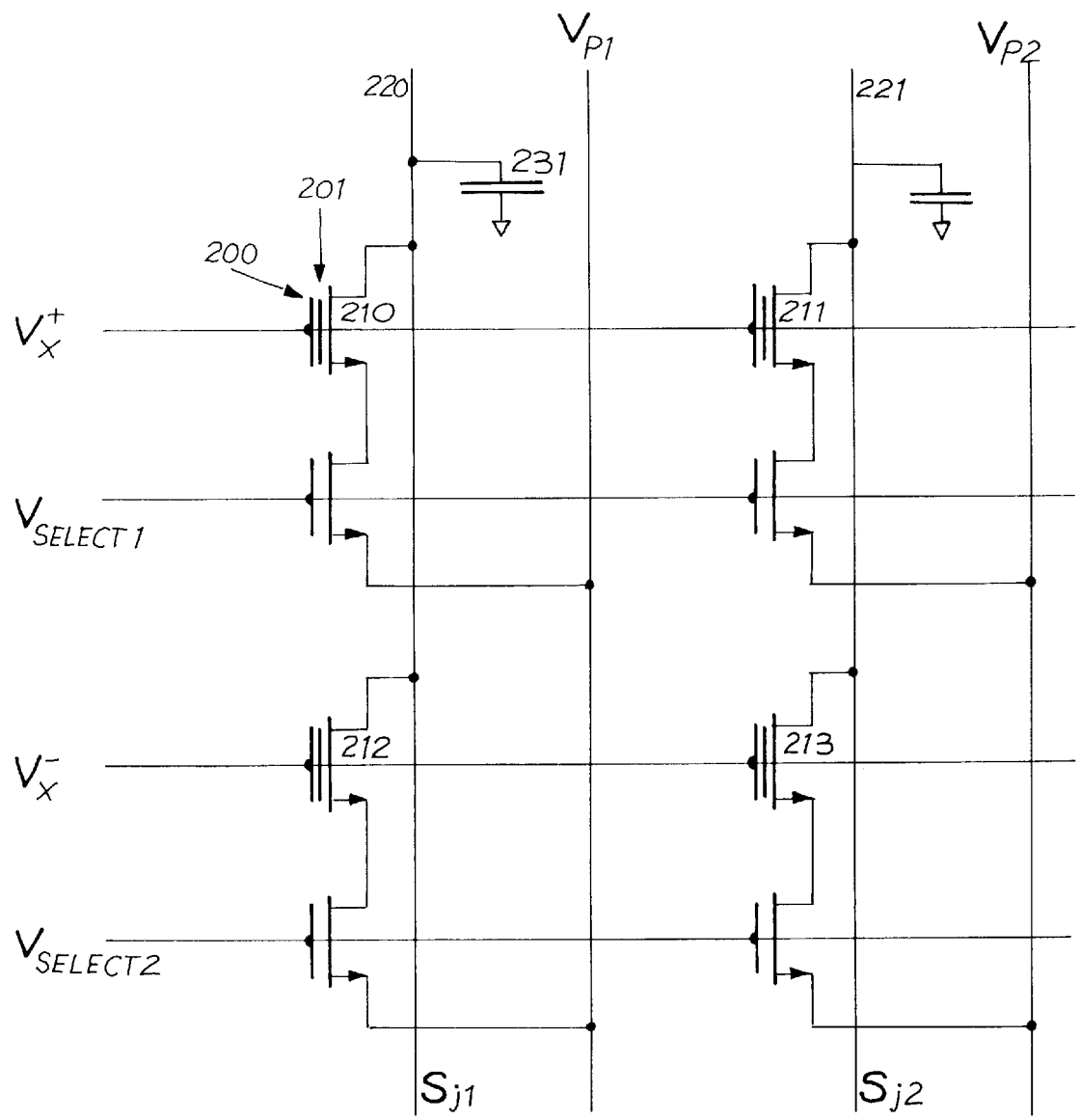
Figure 21:
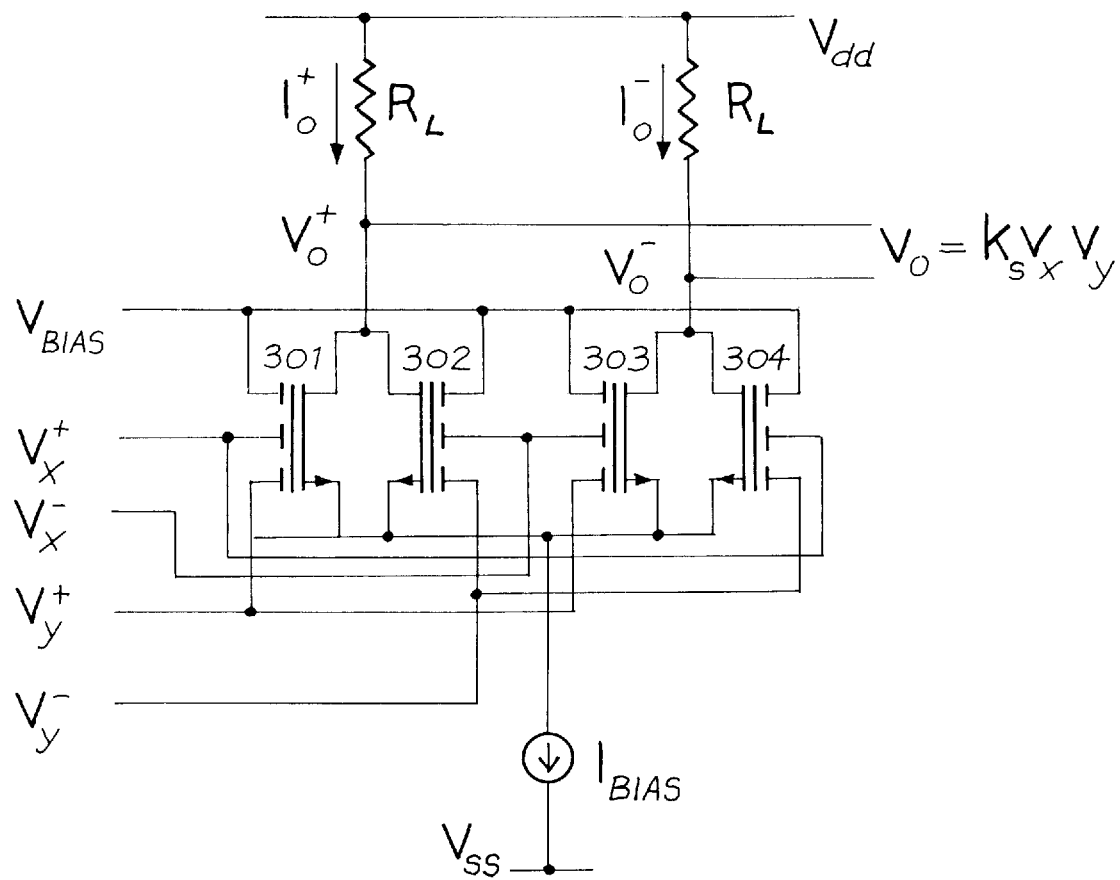
Figure 22:
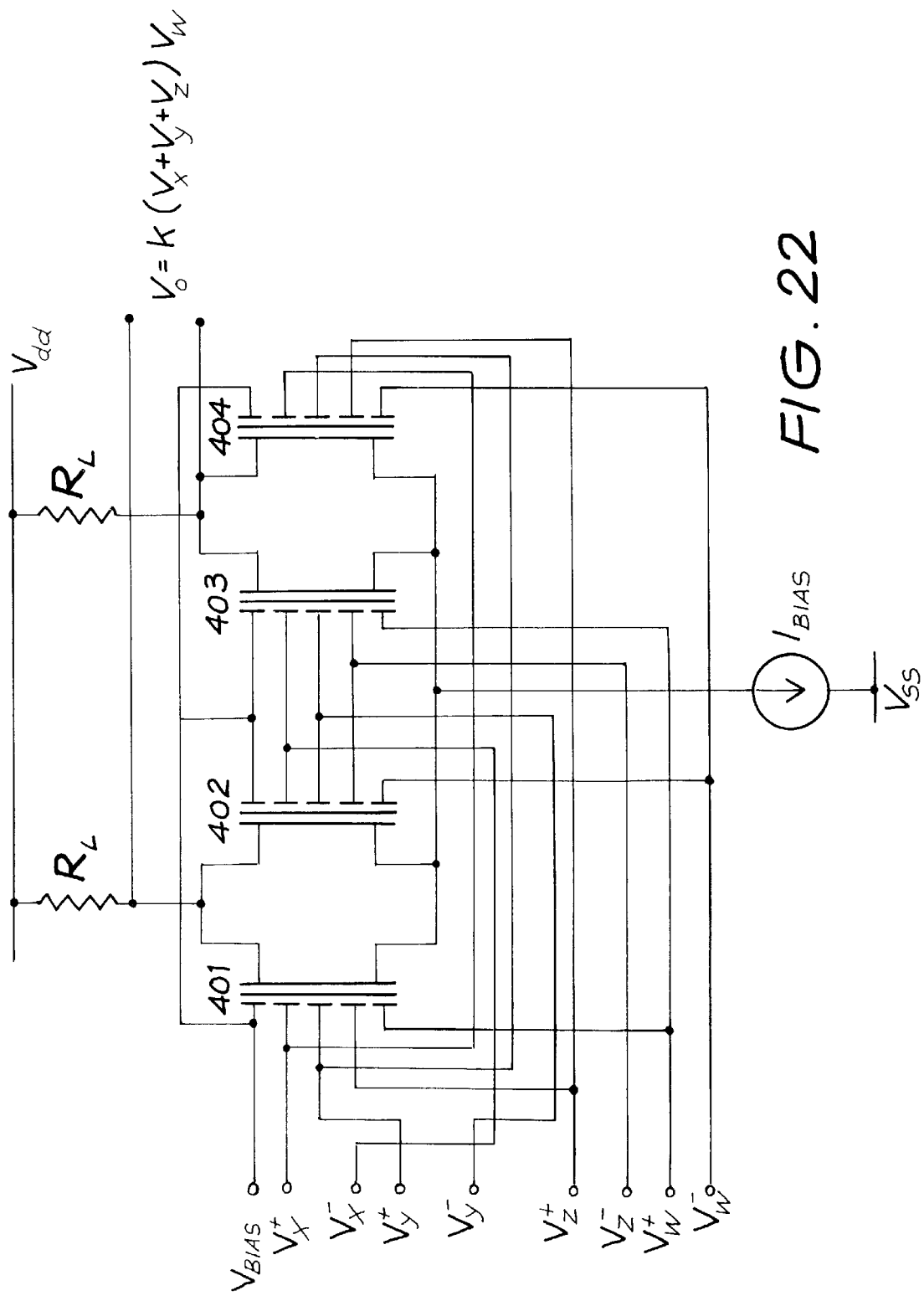
Figure 23:
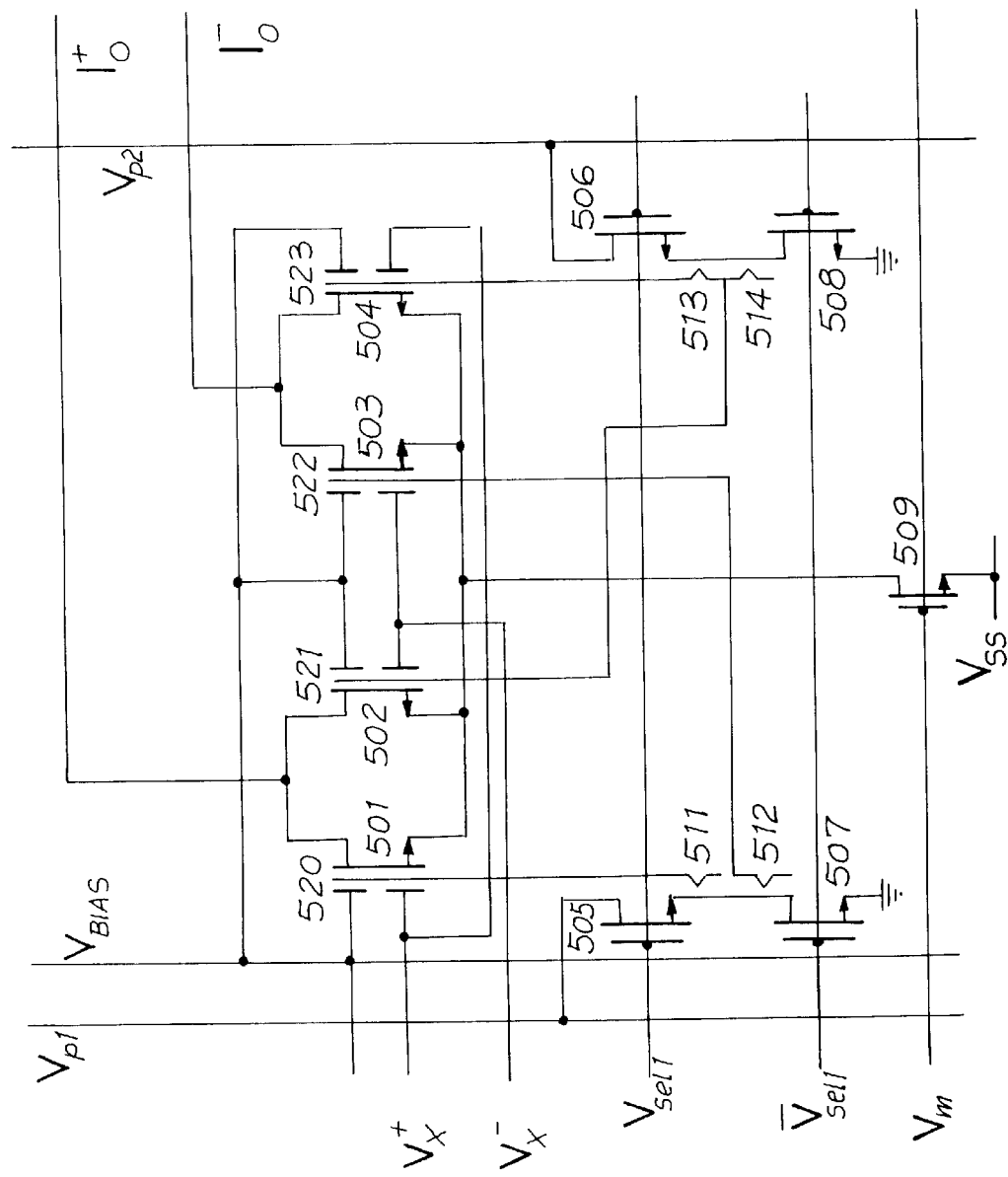
Figure 24:
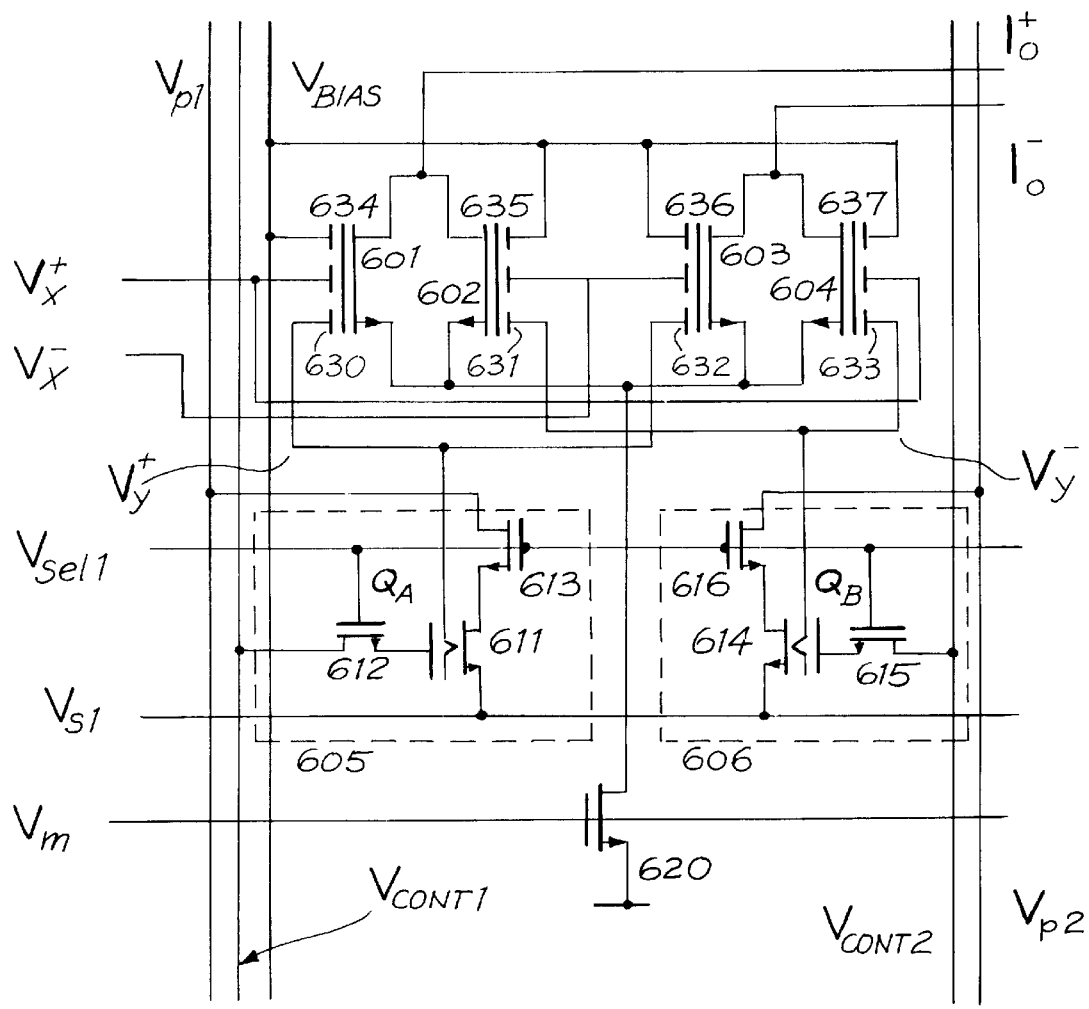
Figure 25:
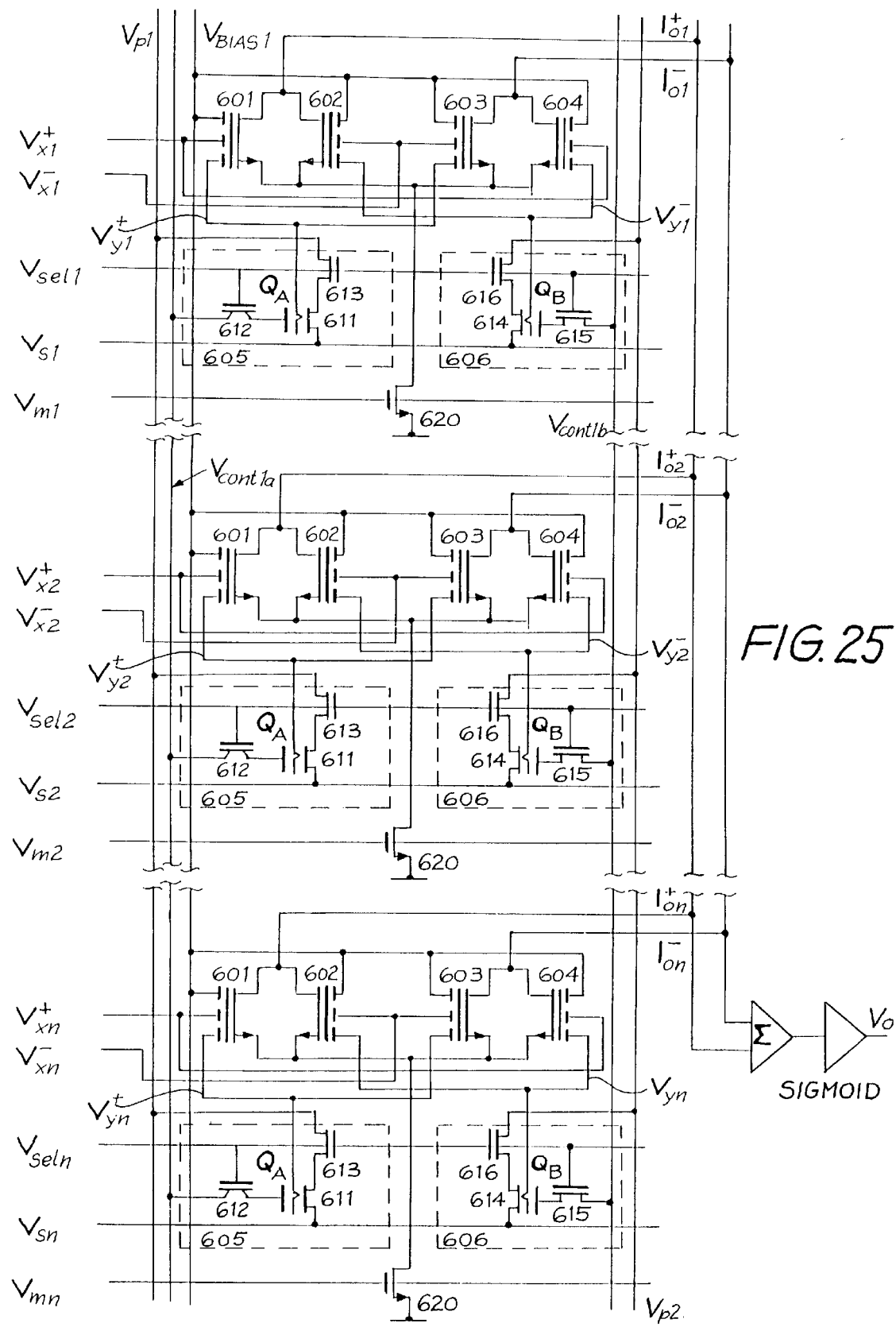
Figure 26:
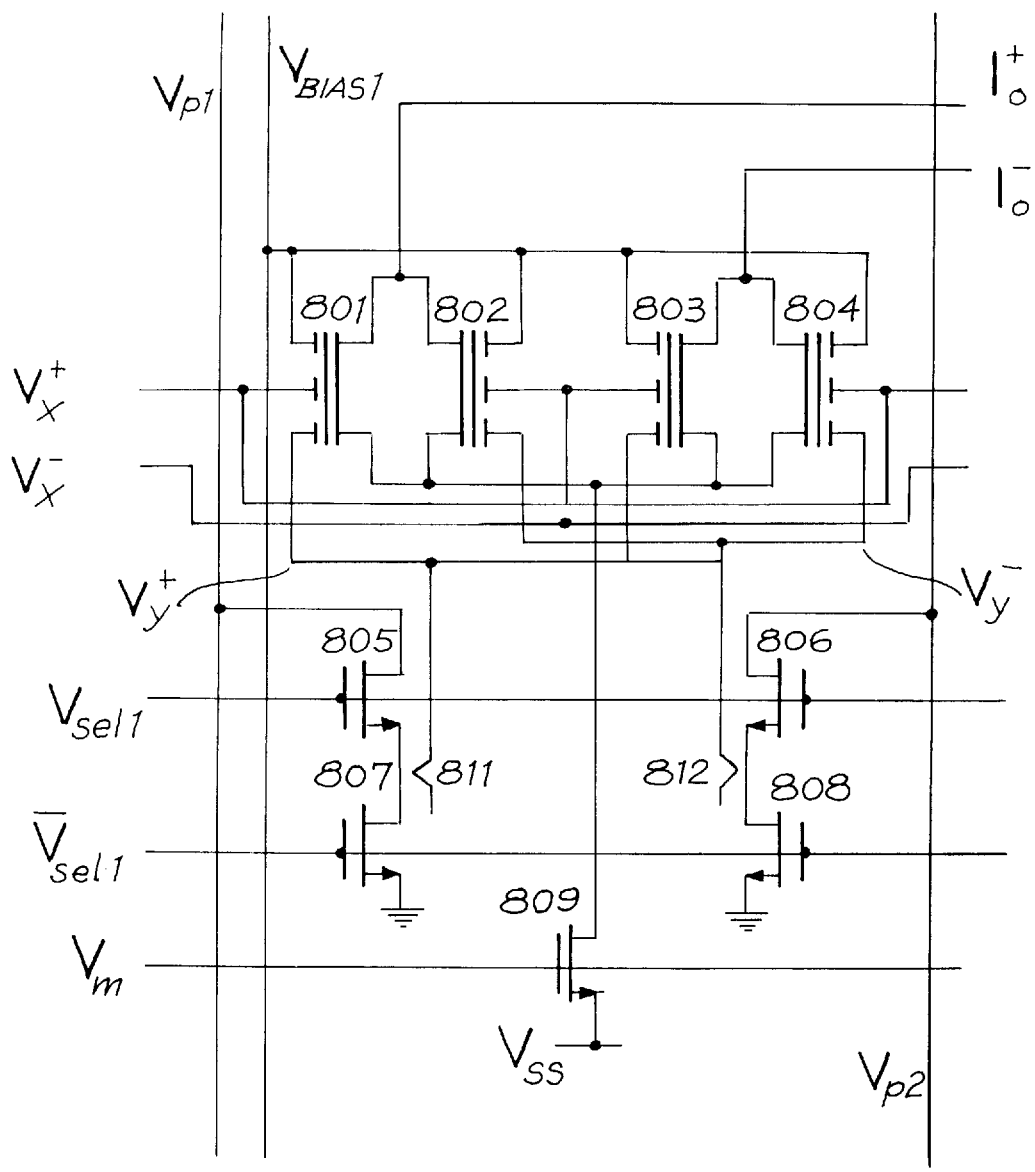
Figure 27:
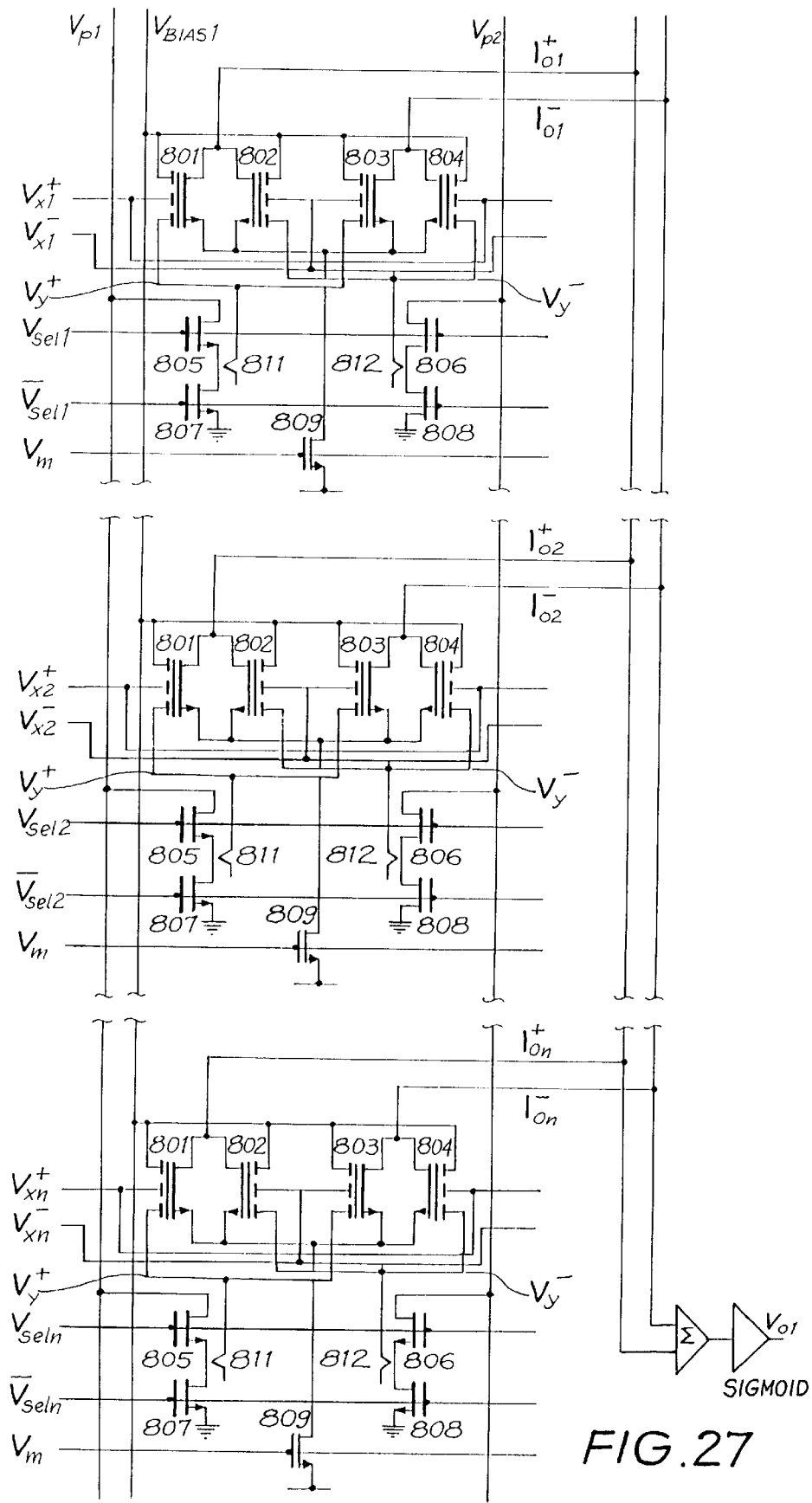

FIG. 19 is a circuit schematic of a neural synapse using simplified Gilbert multiplier and EE PROMS;

FIG. 20 is a circuit schematic of an adaptive synapse cell in an associative network using floating gate transistors;

FIG. 21 is a circuit schematic of a multi-input floating-gate MOS Four Quadrant Analog Multiplier;

FIG. 22 is a circuit schematic of an MFMOS Four Quadrant Analog Summing Multiplier;

FIG. 23 is a circuit schematic of a synaptic cell using an MFMOS multiplier with weight storage in the floating-gate of each MFMOS device;

FIG. 24 is a circuit schematic of a neural synaptic cell using an MFMOS multiplier with EEPROM weight storage;

FIG. 25 is a circuit schematic of an MMOS Neuron employing the synaptic cell of FIG. 24;

FIG. 26 is a circuit schematic of a neural synaptic cell using an MFMOS multiplier with a modified programming scheme; and FIG. 27 is a circuit schematic of a neuron based on the synaptic cell of FIG. 26.

IV. DETAILED DESCRIPTION OF THE PREFERRED EMBODIMENTS

Embodiments of the present invention provide a novel four-quadrant analog multiplier utilising Multiple-input Floating-gate MOS (MFMOS) transistors in which the square law of the MOS transistor is used. Further, embodiments provide a programmable synaptic cell implemented using the four-quadrant analog multiplier. The circuit configuration of the multiplier is simple in comparison with all the other analog multipliers reported so far. It also has a wide input signal range equalling the supply voltage, high linearity, low distortion, large input dynamic range and both inputs have identical characteristics because of the symmetry in the circuit configuration. In section V the basic structure of the MFMOS transistor is described and the main idea of the four quadrant analog multiplier is presented in section VI. In the next section the second order effects are discussed and in the section VII the simulation results are presented and compared with theory. Also the overall performance of the proposed multiplier in comparison to other square-law based MOS analog multiplier are summarised.

V. MFMOS EQUATION

Figure 1A:
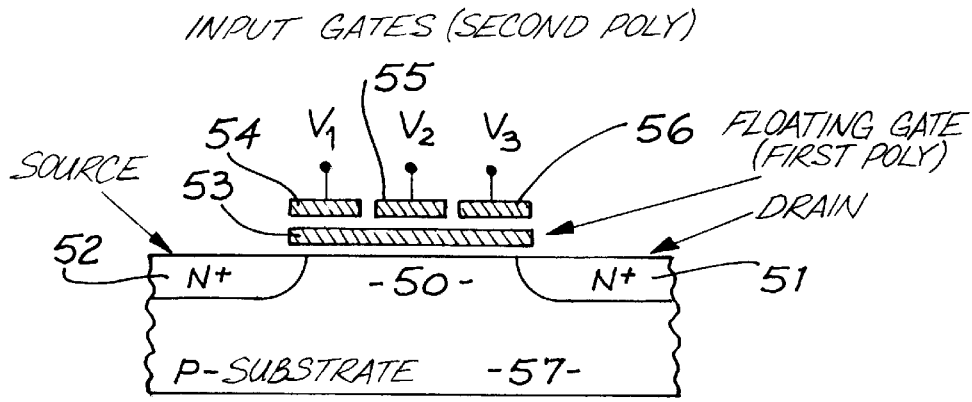
FIG. 1(b) shows voltage relationship between the floating gate and the inputs.
FIG. 1(c) shows symbolic representation of a three input floating gate MOS transistor.
Figure 1B:
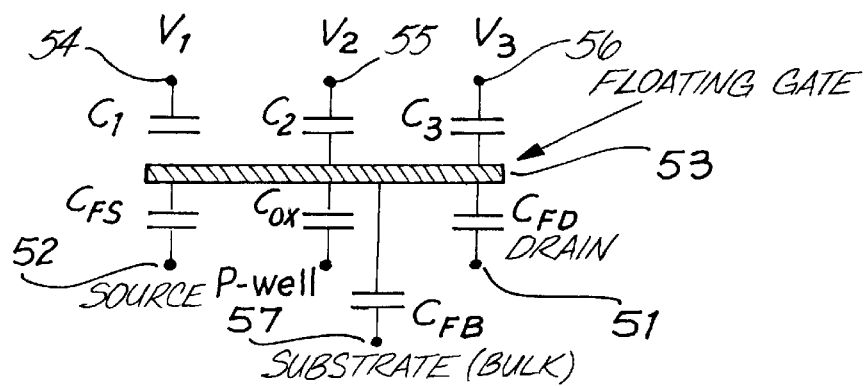
Figure 1C:
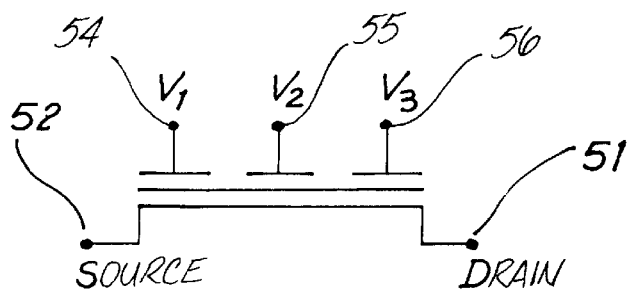

The basic structure of the MFMOS transistor is shown in FIG. 1(a). It consists of an N-channel MOS transistor with a floating gate (first polysilicon layer) over the channel 50 between source 52 and drain 51 formed in substrate 57. An array of control gates 54, 55, 56 (multiple-input structure) are formed by the second polysilicon layer over the floating-gate 53 and the input signals are applied to these multiple-control gates 54, 55, 56. The capacitive coupling between the multiple-control gates 54, 55, 56 and floating gate 53 and the channel 50 is shown in FIG. 1(b) whilst FIG. 1(c) is the symbolic representation of such a device.

It can be shown that the drain current of such a device in saturation is given by the following equation.

$$I_D(\text{sat}) = \frac{1}{2} K \left[ \frac{Q_T}{C_T} + \frac{\sum_{i=1}^{n} C_i V_i}{C_T} + \frac{C_{FD} V_D}{C_T} + \frac{C_{FB}}{C_T} V_B - V_S \left[ 1 - \left( \frac{C_{FS}}{C_T} + \frac{2C_{OX}}{3C_T} \right) \right] - \left( 1 - \frac{2C_{OX}}{3C_T} \right) V_T^* \right]^2 \quad (1)$$

with $$K = \mu_n C_{ox} \left( \frac{W}{L} \right)$$

$\mu_n$=electron mobility
$C_{OX}$=floating gate oxide capacitance per unit area
W=channel width
L=channel length
$Q_T$=total charge stored in floating gate
$C_i$(i=1,2, . . . ,n)=capacitance between floating gate and each of the control gates
$V_i$(i=1,2, . . . ,n)=input voltages
$V_T^*$=threshold voltage as seen from floating gate
$C_{FD}$=overlap capacitance between floating gate and drain
$C_{FS}$=overlap capacitance between floating gate and source
$C_{FB}$=capacitance between floating gate and bulk over the nonactive area
$V_D$=drain voltage
$V_S$=source voltage
$V_B$=bulk voltage $$C_T = \frac{2}{3} C_{ox} + C_{FD} + C_{FS} + C_{FB} + \sum_{i=1}^{n} C_i$$

If the initial charge in the floating gate is assumed to be zero and no charge injection occurs during device operation and also it is assumed that $C_{FD}$ is much less than $C_T$, Eqn.(1) can be simplified to the following form $$I_d = \frac{1}{2} K \left( \sum_{i=1}^{n} W_i V_i + W_B V_B + W_S V_S - W^* V_T^* \right)^2 \quad (2)$$

in which $W_i$=($C_i/C_T$), $W_B$=($C_{FB}/C_T$), $W_S$=-[1-($C_{FS}/C_T$)-($2/3$)($C_{OX}/C_T$)] and $W^*$=1-($2/3$) ($C_{OX}/C_T$)

This is justifiable for long channel devices where we can assume that the channel length modulation effect can be neglected.

VI. PRINCIPLE OF OPERATION OF FOUR-QUADRANT ANALOG MULTIPLIER

With three control gates the Eqn. (2) becomes $$I_d = \frac{1}{2} K (W_1 V_1 + W_2 V_2 + W_3 V_3 + W_B V_B + W_S V_S - W^* V_T^*)^2 \quad (3)$$

Figure 2:
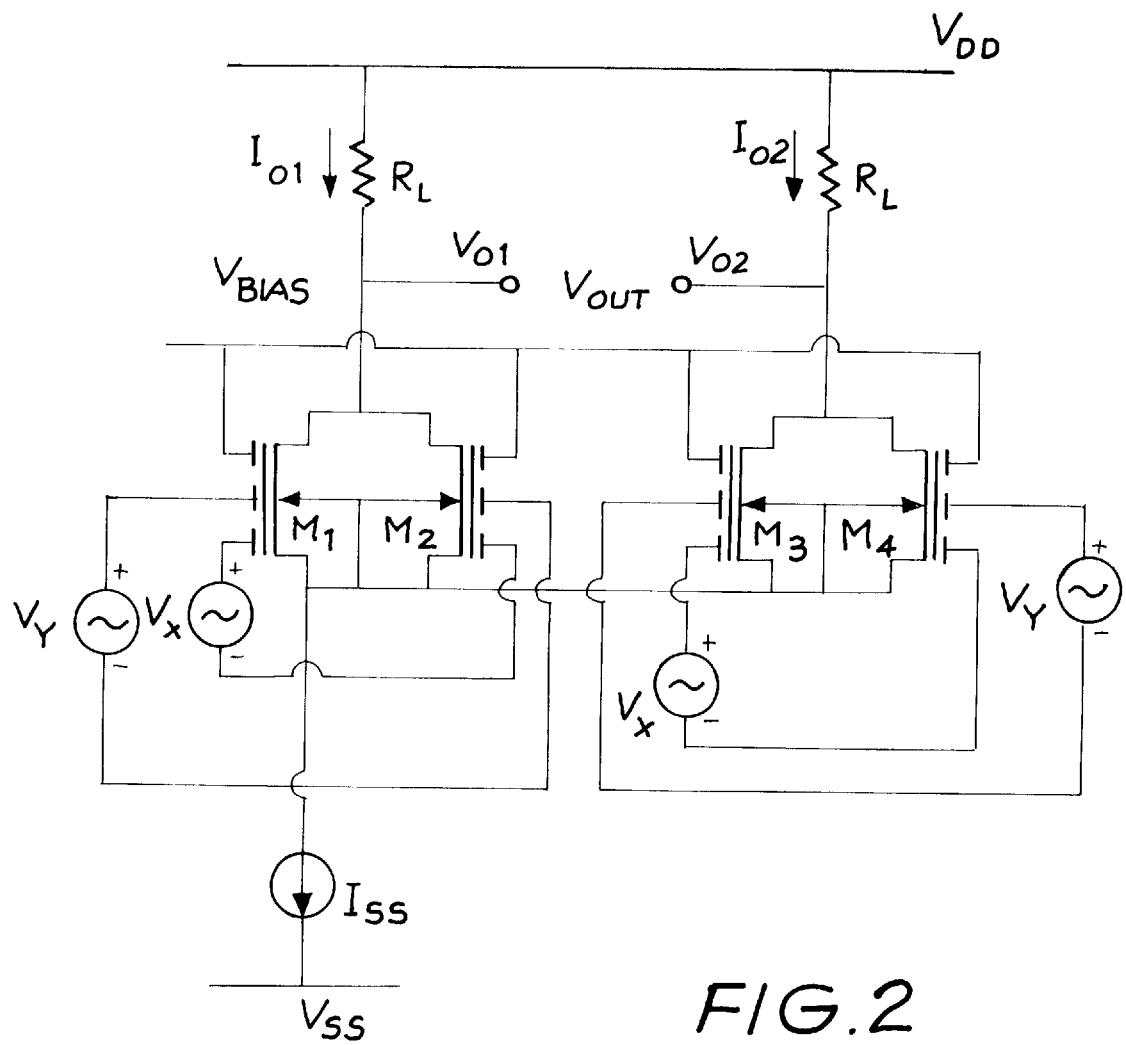
FIG. 2 is the schematic of a four quadrant analog multiplier using MFNIOS transistor with inputs floating (differential)
Figure 3:
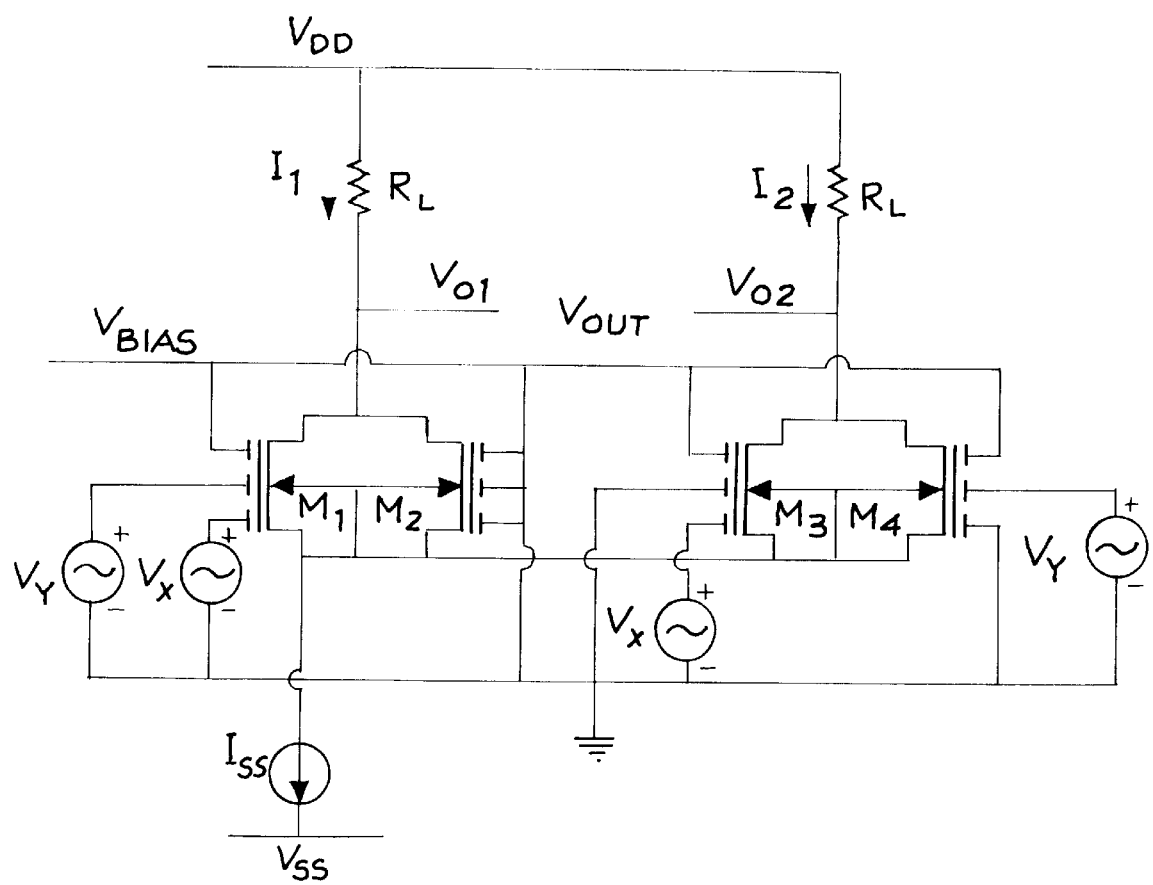
FIG. 3 is the schematic of a four quadrant analog multiplier using MFNIOS transistor with inputs referenced to a signal common (single ended)

An analog multiplier is realised using four MFMOS transistors connected to a common source node and biased by a single current source. The schematic of a four quadrant analog multiplier using MFMOS transistor is shown in FIGS. 2 & 3. Two possible integrated circuit layouts for the four transistor structure used in the circuits of FIGS. 2 & 3 are illustrated in FIGS. 17 and 18a and b, in which reference numerals indicate transistor elements as described with reference to FIGS. 1a, b, & c. FIG. 2 illustrates an embodiment with floating inputs (differential) while FIG. 3 illustrates an embodiment with inputs referenced to a signal earth (single ended). In the embodiment of both FIG. 2 and FIG. 3 transistors M1–M4 are identical and biased to operate in the saturation region. Each MFMOS transistor has three control gates, one of them is used for biasing and the remaining inputs are used for two input signals. Equation (4) shows that the difference of the sum of the currents in $M_1$, $M_2$ and $M_3$,$M_4$ result is the product of the two differential input signals $V_X$ and $V_Y$ $$I_O = I_{O1} - I_{O2} = \quad (4)$$

$$\frac{1}{2} K \left\{ \left[ \left( \frac{1}{2} W_1 V_X + \frac{1}{2} W_2 V_Y + W_3 V_{Bias} + W_B V_B + W_S V_S - W^* V_T^* \right)^2 + \left( -\frac{1}{2} W_1 V_X - \frac{1}{2} W_2 V_Y + W_3 V_{Bias} + W_B V_B + W_S V_S - W^* V_T^* \right)^2 \right] - \left[ \left( \frac{1}{2} W_1 V_X - \frac{1}{2} W_2 V_Y + W_3 V_{Bias} + W_B V_B + W_S V_S - W^* V_T^* \right)^2 + \left( -\frac{1}{2} W_1 V_X + \frac{1}{2} W_2 V_Y + W_3 V_{Bias} + W_B V_B + W_S V_S - W^* V_T^* \right)^2 \right] \right\}$$

$$= K W_1 W_2 V_X V_Y$$

The output voltage is obtained by taking the difference of $V_{O1}$ and $V_{O2}$ $$V_O = V_{O1} - V_{O2} = K R_L W_1 W_2 V_X V_Y \quad (5)$$

Obviously a differential MOS amplifier is needed at the output to subtract $V_{O1}$ and $V_{O2}$, with increases in the gain at the expense of bandwidth reduction.

In the case of single ended input signals, Eqn.(4) becomes $$I_O = I_{O1} - I_{O2} = \quad (6)$$

$$\frac{1}{2} K \{ [(W_1 V_X + W_2 V_Y + W_3 V_{Bias} + W_B V_B + W_S V_S - W^* V_T^*)^2 +$$

$$(W_3 V_{Bias} + W_B V_B + W_S V_S - W^* V_T^*)^2 ] -$$

-continued $$[(W_1V_X + W_3V_{Blues} + W_BV_B + W_SV_S - W^*V_T^*)^2 +$$
$$(W_2V_Y + W_3V_{Bias} + W_BV_B + W_SV_S - W^*V_T^*)^2]\} = KW_1W_2V_XV_Y$$

which again gives the product of two input signals.

If the effect of $C_{FD}$ is included, the output voltage is related to input signals as follow $$V_O = KW^2R_LV_XV_Y + K[W_D^2(V_{O1}^2 - V_{O2}^2) + 2W_D(V_{O1} - V_{O2})(W_3V_{Bias} + W_BV_B + W_SV_S - W^*V_T^*)]R_L \quad (7)$$

where $V_{O1}$ and $V_{O2}$ are the drain voltages of $M_1$, $M_2$ and $M_3$, $M_4$ respectively, $W_D = C_{FD}/C_T$ and assuming $W_1 = W_2 = W$ has been assumed.

Since $W_D$ is usually small, the $W_D^2$ term in Eqn. (7) can be considered as second order effect, resulting in the following expression for the error in the output voltage.

$$V_{ER} \approx 2KR_LW_D(V_{O1} - V_{O2})(W_3V_{Bias} + W_BV_B + W_SV_S - W^*V_T^*) \quad (8)$$

All the terms in the second parenthesis of Eqn.(8) are constant except for $V_S$ which is related to input signals by $$V_S = \frac{1}{W_S}\left[-W_3V_{Bias} - W_BV_B + W^*V_T^* + \frac{1}{2}\sqrt{\frac{2I_{SS}}{K} - W^2(V_X^2 + V_Y^2)}\right] \quad (9)$$

According to (9) the input range of input signals are given by $$(V_X + V_Y)^2 - V_XV_Y \leq \frac{I_{SS}}{W^2K} \quad (10)$$

Substituting (9) into (8) and expansion of the square root in a power series it can be shown that only odd-order distortion components appear at the output of the multiplier due to $W_D$. The third harmonic distortion can be expressed as follows $$|H_{D3}| \approx \frac{1}{8}\left[\frac{KW_DW^2R_L}{\sqrt{\frac{2I_{SS}}{K} - W^2V_Y^2}}V_{AC}^2\right] \quad (11)$$

where one of the inputs $V_Y$ is kept constant and the other input is $V_X = V_{AC}(\sin \omega t)$.

VII. SECOND-ORDER EFFECTS

The basic operation of the multiplier including the effect of $W_D$ has been described without taking into consideration other second order effects, such as the body effect, channel-length modulation, mobility degradation, component and geometry mismatches. The effect of substrate bias is not considered here since the source and substrate of all MFMOS transistors are connected together. If the $W_D$ is neglected the mismatch of the output resistor does not contribute in the total harmonic distortion and it has only an effect on the output offset of the multiplier expressed as $$ER(\Delta R_L) = \frac{1}{2}I_{SS}\Delta R_L \quad (12)$$

Where $\Delta R_L$ is the difference between two output resistors. When the $W_D$ effect is included, the above equation becomes $$ER(\Delta R_L) = \frac{1}{2}I_{SS}\Delta R_L + \quad (13)$$

$$\frac{1}{2}KW_D\Delta R_L(V_{O1} + V_{O2})\sqrt{\frac{2I_{SS}}{K} - W^2(V_X^2 + V_Y^2)}$$

The second term on the right side of (13) produces the even-order harmonic distortion and the second harmonic distortion is given as $$|H_{D2}| \approx \frac{W_DB\Delta R_L}{8R_LV_Y\sqrt{\frac{2I_{SS}}{K} - W^2V_Y^2}}V_{AC} \quad (14)$$

where $B = 2V_{CC} - I_{SS}R_L$ and $V_{AC}$ is the amplitude of the sinusoidal input signal. Since the WD is very small and also $\Delta RL$ is much smaller than RL the harmonic distortion due to the output resistor mismatch is also very small, typically below −80 db. The complete derivation is in appendix III.

The transistor mismatches appear in the form of K, $V_T$ and W (input capacitive coupling ratio) mismatches. It will be shown that the W mismatch is more important and has a major contribution to the total harmonic distortion.

In addition, mobility degradation has an effect on the performance of the multiplier. Here all the second order effects are considered separately to show their contribution to the total harmonic distortion.

A. Threshold Voltage Mismatches

In the multiplier of FIG. (2) mismatches in $V_T^*$ can be expressed as $$V_{Ti}^* = V_T^* + \Delta V_{Ti} \text{ for } i=1,\ldots,4 \quad (15)$$

for each of the four MFMOS transistors.

Substituting (15) into (4) and after some algebraic manipulation, one obtains that the threshold voltage-mismatches produce even-order harmonic distortion. The second harmonic distortion is given by $$|H_{D2}| \approx \frac{W^*\Delta V_T}{8V_Y\sqrt{\frac{2I_{SS}}{K} - W^2V_Y^2}}V_{AC} \quad (16)$$

which $$\Delta V_T = \Delta V_{T4} + \Delta V_{T3} - \Delta V_{T2} - \Delta V_{T1} \quad (17)$$

and $V_{AC}$ is the amplitude of the sinusoidal input.

The complete derivation is in appendix IV.

For decreasing $H_{D2}$ the tail of current source ($I_{SS}$) should be increased as well as decreasing the W/L ratio of all MFMOS transistors. Furthermore a smaller distortion can be achieved by decreasing $\Delta V_T$. For this purpose, as it can be seen from Eqn. (17), during the layout design the four MFMOS transistors should be arranged so that the two pairs of transistors M1, M4 and M2, M3 are made close together. The other possibility is that the two pairs transistor M1, M3 and M2, M4 are made closed as much as possible.

B. Transconductance Parameter (K) Mismatches

To investigate geometry mismatches among MFMOS transistors the transconductance parameter K is expressed by $$K_i = K_0 + \Delta K_i \text{ for } i=1,\ldots,4 \quad (18)$$

Substituting (18) into (4) one can see that the K mismatch among transistors produce both odd and even harmonic distortion as well as dc offset. The second and third harmonic distortions are given by $$|H_{D2}| = \frac{\Delta K'}{K_0} \left( \frac{WV_{AC}}{16\sqrt{\frac{2I_{SS}}{K_0} - W^2V_Y^2}} \right) \tag{19}$$

and $$|H_{D3}| = \frac{\Delta K''}{K_0} \left( \frac{WV_{AC}^2}{32V_Y\sqrt{\frac{2I_{SS}}{K_0} - W^2V_Y^2}} \right) \tag{20}$$

the dc offset output voltage is expressed as follows $$V_O(\text{offset}) = \frac{\Delta K I_{SS}}{4K_0} \tag{21}$$

in which $$\Delta K = \Delta K1 + \Delta K2 - \Delta K3 - \Delta K4$$

$$\Delta K' = \Delta K1 + \Delta K3 - \Delta K2 - \Delta K4$$

$$\Delta K'' = \Delta K1 + \Delta K4 - \Delta K2 - \Delta K3 \tag{22}$$

Similarly to decrease the distortion caused by K mismatch three parameters $\Delta K$, $\Delta K'$ and $\Delta K''$ should be decreased as much as possible. Hence it is important that during the circuit layout design to arrange M1 close to M2 and M3 close to M4 whilst M1 and M3 can be far from M2 and M4 respectively.

C. Capacitive Coupling Ratio Mismatches

The coupling ratio (W) can have significant impact on the performance of the multiplier. Each MFMOS transistor has three control gates. Two of them are used for input signals and the remaining is for biasing. To investigate the effect of input coupling ratio mismatches on the output voltage it is assumed that there is no mismatch between the third gate of each transistor used for biasing. In order to simplify and derive a closed form expression, it is assumed that the coupling ratio of the two control gates within each transistor are matched. This assumption is not unreasonable since the two control gates of each transistor are relatively close together in comparison with the control gates of different transistors. The mismatch between W can be expressed as follows, for each of the MFMOS transistors M1 to M4

$$W_i = W + \Delta W_{Mi} \text{ for } i=1, \ldots, 4 \tag{23}$$

By using (23) in Eqn. (4), it follows that:

$$I_O = I_{O1} - I_{O2} = \tag{23}$$

$$\frac{1}{2} K \left\{ \left[ \left( \frac{1}{2} W(V_X + V_Y) + \frac{1}{2} \Delta W_1(V_X + V_Y) + \right.\right.\right.$$

$$W_3 V_{Bias} + W_B V_B + W_S V_S - W^* V_T^* )^2 +$$

$$\left( -\frac{1}{2} W(V_X + V_Y) - \frac{1}{2} \Delta W_2(V_X + V_Y) + \right.$$

$$W_3 V_{Bias} + W_B V_B + W_S V_S - W^* V_T^* )^2 ] -$$

-continued $$\left[ \left( \frac{1}{2} W(V_X - V_Y) + \frac{1}{2} \Delta W_3(V_X - V_Y) + \right.\right.$$

$$W_3 V_{Bias} + W_B V_B + W_S V_S - W^* V_T^* )^2 +$$

$$+ \left( -\frac{1}{2} W(V_X - V_Y) - \frac{1}{2} \Delta W_4(V_X - V_Y) + \right.$$

$$W_3 V_{Bias} + W_B V_B + W_S V_S - W^* V_T^* )^2 ] \right\}$$

It can be shown that the W mismatch produces both odd and even harmonic distortion. The second and third harmonic distortion are given by the following expressions.

$$|H_{D2}| = \left( \frac{\Delta W}{8WV_Y} + \frac{\Delta W'}{16\sqrt{\frac{2I_{SS}}{K} - W^2V_Y^2}} \right) V_{AC} \tag{25}$$

$$|H_{D3}| = \frac{\Delta W''}{32V_Y\sqrt{\frac{2I_{SS}}{K} - W^2V_Y^2}} V_{AC}^2 \tag{26}$$

Where $$\Delta W = \Delta W_{M1} + \Delta W_{M2} - \Delta W_{M3} - \Delta W_{M4}$$

$$\Delta W' = \Delta W_{M1} + \Delta W_{M3} - \Delta W_{M2} - \Delta W_{M4}$$

$$\Delta W'' = \Delta W_{M1} + \Delta W_{M4} - \Delta W_{M2} - \Delta W_{M3} \tag{27}$$

It is clear from equation (27), that in order to minimise the effect of coupling ratio mismatch, the control gates of the two pairs of transistors M1, M4 and M2, M3 should be as close as possible to give the smallest relative mismatch in each pair. Hence, by this means only the $\Delta W$ and $\Delta W'$ decrease whilst the $\Delta W''$ will not decrease but, as can be seen from the simulation results in the next section the effect of second harmonic distortion is higher than the effect of third harmonic distortion and that the first term on the right hand side of Eqn. (25) has the most significant contribution to the harmonic distortion.

To investigate the third input coupling ratio $W_3$ used for biasing, it is assumed that the remaining coupling ratios are matched. Then the mismatch of $W_3$ can be expressed as follows $$W_{3i} = W_3 + \Delta W_{Mi} \text{ for } i=1, \ldots, 4 \tag{28}$$

Substituting (28) into (4) and rearranging, it is found that the $W_3$ mismatch only produces the even-order harmonic distortion. It can be shown that the second harmonic distortion is given by the following expression $$|H_{D2}| = \frac{V_{Bias}\Delta W_3}{8V_Y\sqrt{\frac{2I_{SS}}{K} - W^2V_Y^2}} V_{AC} \tag{29}$$

Where $$\Delta W_3 = \Delta W_{3M1} + \Delta W_{3M2} - \Delta W_{3M3} - \Delta W_{3M4} \tag{30}$$

Similar to previous discussion the control gates of the transistors M1, M4 and M2, M3 should be as close as possible to decrease the effects of $W_3$ mismatch on the performance of the multiplier.

D. Mobility Degradation

The carrier mobility model used to estimate the effect of mobility degradation under high field conditions is given by $$\mu = \frac{\mu_0}{1 - \theta(V_{GS} - V_T)} \quad (31)$$

where $\mu_0$ represent zero field mobility of carriers and $\theta$ is the mobility degradation parameter which varies from 0.001 $V^{-1}$ to 0.1 $V^{-1}$. Substituting (31) into (4), with further algebra manipulation, it can be found that only odd-order harmonic distortion is produced due to mobility degradation, and the third harmonic distortion is given by $$|H_{D3}| \approx \frac{3\theta W^2}{16\sqrt{\frac{2I_{SS}}{K} - W^2 V_Y^2}} V_{AC}^2 \quad (32)$$

Following the results of the analysis of second order effects due to mismatches in the threshold voltages ($\Delta V_T$—equations 16,17), coupling ratios ($\Delta W$—equations 29,30), and transconductance ($\Delta K$—equations 19,22), discussed above, two possible layout embodiments are shown in the FIGS. 17 and 18, which try to bring device pairs into as close proximity to each other as possible.

The layout of FIG. 17 brings the device pairs close together, that is the transistor and the coupling capacitors for the pair $M_1$, $M_3$ are brought into close proximity and similarly for the pair $M_2$, $M_4$. Note that the coupling capacitors for the pair $M_1$, $M_4$ are separated from the pair $M_2$, $M_3$ by the transistors. The layout of the capacitor connections is designed to be alignment insensitive.

In the layout of FIG. 18, the transistor pairs are separated by the coupling capacitors. The coupling capacitors for the pair $M_1$, $M_4$ and for the pair $M_2$, $M_3$ are in close proximity but VT matchings between $M_1$ and $M_4$, $M_2$ and $M_3$ are not the best.

VIII. SIMULATION RESULT AND DISCUSSION

The proposed multiplier circuit FIG. 3 was simulated with bias current $I_{SS}=120$ $\mu A$, W:L ratio of 10:20 for all MFMOS devices and supply voltage of ±5 V. The simulation results were obtained by using the CMOS device and process parameters for a 2 $\mu m$ double metal double poly CMOS process provided by ORBIT chip foundry. The input coupling capacitance for the input signals and the biasing are 444 fF and 196 fF respectively. FIG. 4 shows the third harmonic distortion caused by feedback from drain due to the $C_{FD}$, overlap capacitance between the floating gate and drain, expressed in terms of the coupling ratio $W_D$. For typical values of $C_{FD}$=3.4 fF, the distortion is less than −90 db. Therefore it has a small contribution to the total harmonic distortion but might not be the case when short channel lengths are used. FIG. 5 shows the second harmonic distortion result due to $V_T$ mismatch with respect to the percentage of relative threshold mismatch about a threshold voltage of 800 mv. For smaller input signals $V_Y$, it shows a larger distortion of about −50 db at one percent mismatch in the worst case, where $\Delta V_T$ in Eqn. (17) assumes its maximum value. Equation (16) confirms this dependence on $V_Y$. FIG. 6 shows the second and third harmonic distortion caused by transconductance parameter mismatch in different relative mismatch configurations as a function of K mismatch. In the calculation of the second harmonic distortion, it is assumed that $\Delta K'$ has maximum value in which case $\Delta K''$ equals zero as seen in Eqn. (22). In a similar way, $\Delta K''$ is supposed to have its maximum value when simulating for the third harmonic distortion. As it can be seen from results in FIG. 6, $V_Y$ has a small effect on the second harmonic distortion whilst the third harmonic distortion increases with decreasing $V_Y$ as expected from Eqn. (20). FIGS. 7 & 8 show the distortion due to input coupling ratio mismatch in different relative mismatch configurations, described in equation (27), when equal relative mismatch is assumed for each coupling capacitor. In Eqn. (25), the second harmonic distortion expression has two terms, showing its dependence on $\Delta W$ and $\Delta W'$. From equation (27), it can be seen that if $\Delta W1$ and $\Delta W2$ have a +1% variation and $\Delta W3$ and $\Delta W4$ have −1% variation, then $\Delta W$ would assume its maximum value whilst $\Delta W'$ is zero. Conversely, if $\Delta W1$ and $\Delta W3$ have a +1% variation and $\Delta W2$ and $\Delta W4$ have −1% variation, then $\Delta W'$ assume its maximum value and $\Delta W=0$. From curve (a) of FIGS. 7 & 8, $\Delta W$ makes a larger contribution to the second harmonic distortion than $\Delta W'$, giving a −50 db distortion at 1% mismatch in all the input coupling capacitances between devices where the variation of mismatch is chosen in such a way as to give maximum $\Delta W$ and hence $\Delta W'=0$. An alternative assignment of the 1% mismatch would result in $\Delta W=0$ and curve (b) expresses the second harmonic distortion due to $\Delta W'$. Curve (c) gives the third harmonic distortion due to $\Delta W''$. It should be noted that for equal 1% mismatch in all devices, when $\Delta W''$ assumes its maximum value, then $\Delta W=\Delta W'=0$. Hence the curves (a)–(c) really describe the worst case conditions. In practice, any combination of the relative mismatches would be less than this. Therefore, it is important, during the layout design of the circuit, to arrange (i) the control gates of the M1 close to that of the M4 and the control gates of the M2 close to that of the M3 or (ii) the control gates of the M1 close to that of the M3 and the control gates of the M2 close to that of the M4, in order to achieve the smallest value for $\Delta W$ because it has the largest contribution to the second harmonic distortion. FIG. 9 shows the second harmonic distortion caused by mismatch in the biasing input capacitance. It can be seen from the simulation results that smaller $V_Y$ gives the larger distortion as expected from Eqn.(29). The distortion reaches to about −70 db at 1% mismatch amongst the biasing input coupling capacitance which is smaller than the distortion due to the mismatch in other parameters. However the distortion can be decreased much more in the same way as in the previous discussion to reach a smaller value for $\Delta W_3$, as it is clear from Eqn. (30). FIG. 10 shows the third harmonic distortion caused by mobility degradation as a function of the sinusoidal amplitude of $V_X$. FIG. 11 shows the simulated total harmonic distortion as a function of $V_X$ with $V_Y$ held at 5 volts. It can be seen that the total harmonic distortion is about 0.5 percent for one percent mismatch on all parameters and using a mobility degradation parameter of 0.03. FIGS. 12 & 13 show the simulated nonlinearity of this type of multiplier with all components matched. The range of the nonlinearity is about ±3 mv when the $V_X$ changes from −5 to +5 volts and $V_Y$ held at 5 volts. Therefore, the ratio of the maximum nonlinearity to the input range of input voltage is about ±0.03%. The maximum value of nonlinearity of this multiplier with 1% mismatch on selected parameters at input signal levels equal to supply voltage rail are as follows:

| component (1% mismatch) | nonlinearity |
|---|---|
| input capacitive coupling (W) | ±0.06% |
| input capacitive coupling (W3) | ±0.05% |
| transconductance parameter (K) | ±0.07% |
| threshold voltage ($V_T$) | ±0.065% |

FIG. 14 shows the simulated performance of the multiplier as a frequency doubler. The input signals are two in-phase 10-Khz sine waves of 10 Vp–p. FIG. 15 demonstrates the simulation results of the multiplier being used as an amplitude modulator where a 100-Khz sine wave, 10 Vp–p is modulated by a 5-Khz triangular wave, 10 Vp–p. The dc transfer characteristics of the multiplier is shown in FIG. 16, for value of $V_Y$ from −5 V to +5 V in steps 1 volts, as $V_X$ is ramped from −5 to +5 volts. It should be noted that an identical dc transfer characteristic is obtained when the roles of $V_X$ and $V_Y$ are interchanged, which is not available in any of the previously reported analog multipliers. The overall performance of this floating gate multiplier in comparison to other square-law type MOS analog multiplier are tabulated below.

greater than 1%. The floating gate multiplier has a large dynamic input range, not available in the other types of MOS multipliers. Furthermore, the X and Y inputs of the floating gate multiplier have identical input characteristics.

APPLICATION OF MULTIPLIER TO SYNAPTIC CELLS

The principle of operation of synaptic cells hinges on the novel analog multiplier circuit hereinbefore described with reference to FIGS. 2 and 3. The Multi-input Floating-gate MOS Four Quadrant Analog Multiplier, discussed with reference to FIGS. 2 and 3 is represented again in FIG. 21 with notations more convenient for the following description

| | Voltage Supply (volts) | Input Voltage (volts) | THD | Non-Linearity | Active Area (mm2) | Power (mW) | BW (MHz) | Offset Voltage (mV) |
|---|---|---|---|---|---|---|---|---|
| PERFORMANCE COMPARISON OF FOUR-QUADRANT MULTIPLIERS IMPLEMENTED BY SIMPLE MOS TRANSISTORS | | | | | | | | |
| Soo & Meyer [IEEE,SC-17, Dec. 1982, p 1174] | ±10 | $V_x$ ±0.4 $V_y$ ±0.7 | 60% | 0.3% (at 75% FS) | 0.29 | NA | 1.5 | 15 (i/p) |
| Hong & Melchoir [Electronics Lett., Vol. 21, No. 12, June, 1985, p 531] | ±5 | ±4 | <2.0% | <2.0% | 0.53 | 5 mW | 0.8 | 0–100 (i/p) |
| Babanezhad & Temes [IEEE, SC-20, Dec. 1985, p 1158] | 22 | 20 $V_{p-p}$ | N.A | 1.6% (at $V_y$ = 10 v $V_x$ = 20 $V_{p-p}$) | NA | NA | 1.2 | NA |
| Bult & Wallinga [IEEE, SC-21, June, 1986, p 430] | NA | NA | 0.64% (50% of supply current) | 0.41% (40% of supply current) | 0.076 | NA | 4.5 | NA |
| Wong, Kalyanasundram & Salama [IEEE, SC-21, Dec. 1986, p 1120] | ±5 | ±2.5 | <3.0% | NA | 0.3 | 6.5 | 1.6 | 5 (o/p) |
| Qin & Geiger [IEEE, SC-22, Dec. 1987, p 1143] | ±5 | ±4 | NA | <0.5% (at 75% FS) | 0.13 | NA | >0.5 | NA |
| Pena-Finol & Connelly [IEEE, SC-22, Dec. 1987, p 1064] | ±5 | ±2.5 | 0.59% ($V_1$) 0.73% ($V_2$) | 0.44% | 0.322 | 10 | 5.0 ($V_2$) 1.5 ($V_1$) | 8 (i/p) |
| Song & Kim [IEEE, SC-25, June 1990, p 841] | ±5 | ±2 | 0.6% ($V_1$: 1 Vp–p $V_2$: 2 $V_{dc}$) | 0.45% | 1.2 (incl. B.P.) | 8 | 30 | 2 (o/p) |
| Wang [IEEE, SC-26, Sept. 1991, p 1293] | ±5 | ±2.5 | NA | 1.0% | 0.138 | 6 | 1.2 | NA |
| Kim & Park [Ana. Int. Circt. & Sig. Proc., Vol. 2, 1992, p 95] | ±5 | 5 $V_{p-p}$ | <1.0% | <1.0% | 0.54 | 40 | 30 | NA |
| PERFORMANCE OF FOUR-QUADRANT MULTIPLIERS IMPLEMENTED BY MULTIPLE-INPUT FLOATING-GATE MOS TRANSISTORS | | | | | | | | |
| Kwok & Mehrvarz [simulation results, 1% mismatch on all parameters] | ±5 | ±2.5 | <0.2% | <0.1% | 0.04 | 1.2 | NA | NA |
| Kwok & Mehrvarz [simulation results, 1% mismatch on all parameters] | ±5 | ±5 | <0.5% | <0.1% | 0.04 | 1.2 | NA | NA |
| Kwok & Mehrvarz [measured] | ±5 | ±5 | 0.48% (10 KHz, RL 27 KΩ) | 0.3% | 0.04 | 1.2 | 12 (RL 1 kΩ) | 1.0 (o/p) |

The input voltage range, THD and nonlinearity figures speak for themselves. For the first six reported cases above, it ought to be noted that once the input ranges are slightly exceeded, the THD and linearity figures would be much of neural networks. It has been shown that the output voltage $V_0$ (or difference of the output currents $I_0^-$ and $I_0^+$) for this multiplier is proportional to the product of the inputs $V_X$ and $V_y$:

$$V_0 = K_3 V_x V_y$$

where the inputs can accommodate large input dynamic range equalling the supply voltage range (typically, Vcc=5 volts and Vss=−5 volts) while still maintaining very good linearity performance. Furthermore, by having more than three input (control) gates per floating-gate MOS transistor, it is possible for the circuit in FIG. 22 to function as a four quadrant summing multiplier. For the particular input signal connection configuration of FIG. 22, the output voltage $V_0$ is given as follows:

$$V_0 = K_4 (V_x + V_y + V_Z) \cdot V_W$$

where the three inputs $V_x$, $V_y$, $V_z$ are summed and multiplied by a fourth input signal $V_W$. A minor alteration of the $V_z$ input signal connection configuration (similar to that of $V_W$) would yield the following:

$$V_0 = K_4 (V_x + V_y) \cdot (V_Z + V_W)$$

which is the product of the sum of two signals.

For specific applications to neural synaptic cells, one possible embodiment involves introducing charges into the floating-gates of the MFMOS multiplier described earlier, and harnessing its large dynamic input range capabilities and excellent linearity. With reference to FIG. 23, the devices 501, 502, 503 and 504 can have charge levels $Q_1$, $Q_2$, $Q_3$ and $Q_4$ respectively in their floating-gates which are denoted as the primary floating gates 520, 521, 522 and 523. If $Q_1=Q_3=Q_A$ and $Q_2=Q_4=Q_B$, the output differential current $I_0$ is given by $$I_0 = I_0^+ - I_0^- = K_5 V_x (Q_A - Q_B)$$

The term $(Q_A - Q_B)$ constitutes the neural weight of the neural connection. Clearly, the multiplication is four quadrant since $(Q_A - Q_B)$ can assume either positive or negative values depending on the relative magnitude of $Q_A$ and $Q_B$, hence enabling the synaptic cell to exercise both excitatory and inhibitory functions. In order to facilitate the charging of the primary floating-gates 520, 521, 522 and 523, the floating-gates (1st polysilicon layer) 520, 522 of devices 501 and 503 extend over to the source/drain of select devices 505/507 by way of special thin oxide tunnelling structures 511 and 512 (electron injection by Fowler-Norheim tunnelling), whose effective coupling area should be small, typically 1 μm by 1 μm. A similar arrangement exists for the primary floating-gates 521, 523 of devices 502 and 504 to the source/drain of select devices 506 and 508 via the tunnelling structure 513 and 514 shown in FIG. 23. An important consideration in this design is to ensure that the coupling capacitance of the tunnelling structures 511–514 is small when compared to the associated total capacitance of their respective floating-gate. It is assumed that in all the embodiments described below that the MFMOS sizing, coupling capacitor sizing and floating-gate areas are optimised for the gain, dynamic range and maximum voltage drop across the tunnelling structure for the given programming voltage, $V_{pp}$, and supply voltages $V_{CC}$ and $V_{SS}$.

If the primary floating-gates 520, 521, 522 and 523 of devices 501 and 503 are to be programmed, the $V_x^+$, $V_x^-$ and $V_{bias}$ have to be set to the programming voltage $V_{pp}$ whilst the gate of devices 505 and 506 are set high. $V_{P1}$ is set to the lowest possible potential ($V_{SS}$) to ensure that the maximum voltage difference $V_{tun1}$ appears across the tunnelling coupling capacitances of the tunnelling structures 511 and 512. On the other hand, since $V_x^+$, $V_x^-$ and $V_{bias}$ are also connected to the devices 502 and 504, during the programming cycle, the floating-gate voltage of devices 502 and 504 will rise. To minimise the tunnelling voltage $V_{tun2}$ across the coupling capacitances of the tunnelling structures 513 and 514, a proper voltage needs to be applied to $V_{P2}$ ($V_{CC}$) since device 506 is also selected. To erase the charge in the floating-gate of devices 501 and 503, $V_x^+$, $V_x^-$ and $V_{bias}$ are grounded and the programming voltage $V_{PP}$ is applied to the programming line $V_{P1}$ with devices 505 and 506 selected. The electrons will tunnel from the floating-gate of 501 and 503 into the source/drain of devices 505/507 respectively. The two devices 507 and 508 would ensure a negligible disturbance on the other cells during programming and erasing of a certain cell when selecting the devices 507 and 508 and disabling devices 505 and 506. The table below summarises the programming and erasing conditions for the floating-gate of devices of 501 and 503.

| F-G of 501/503 | $V_{bias}$ | $V_x^+$ | $V_x^-$ | $V_{sel1}$ | $\overline{V_{sel1}}$ | $V_{P1}$ | $V_{p2}$ |
|---|---|---|---|---|---|---|---|
| Programming | $V_{pp}$ | $V_{pp}$ | $V_{pp}$ | $V_{pp}$ | $V_{ss}$ | $V_{ss}$ | $V_{cc}$ |
| Adj. cell (vertical) | $V_{pp}$ | 0 | 0 | $V_{ss}$ | $V_{pp}$ | $V_{ss}$ | $V_{cc}$ |
| Adj. cell (horizontal) | 0 | $V_{pp}$ | $V_{pp}$ | $V_{pp}$ | $V_{ss}$ | 0 | 0 |
| Erasing | 0 | 0 | 0 | $V_{pp}$ | $V_{ss}$ | $V_{pp}$ | 0 |
| Adj. cell (vertical) | 0 | 0 | 0 | $V_{ss}$ | $V_{pp}$ | $V_{pp}$ | 0 |
| Adj. cell (horizontal) | 0 | 0 | 0 | $V_{pp}$ | $V_{ss}$ | 0 | 0 |
| Normal operation | $V_{cc}$–$V_{ss}$ | $V_{cc}$–$V_{ss}$ | 0 | $V_{ss}$ | $V_{pp}$ | — | — |

Under normal operations, the gates of devices 507 and 509 are high ($\overline{V_{sel1}}$) and the gates of devices 505 and 506 are low($V_{sel1}$), whilst the voltages on Vp1 and Vp2 do not matter. Normal supply voltages of +/−5 volts to the multiplier are assumed.

The assumption that charge levels $Q_1=Q_3$ and $Q_2=Q_4$ in the primary floating-gate of devices 501–504 may not necessarily be always met. This depends on the tunnelling characteristics of the thin oxide in each of the tunnelling structures 511–514. Any mismatch between charge levels $Q_1$ and $Q_3$ and mismatch between charge levels $Q_2$ and $Q_4$ would result in larger output offsets and linearity errors.

Another preferred embodiment of a neural synapse employing the MFMOS multiplier concept, which avoids the above mentioned sensitivity to charge equality of Q1 to Q3 and Q2 to Q4, is shown in FIG. 24. A third input of the MFMOS multiplier constitutes the weight or strength of the synaptic connection and the weight is determined by the difference in charge in the floating-gate of two EEPROM devices 611 and 614. As shown in FIG. 24, the floating-gate of EEPROM devices 611 extends over to and on the top of the first floating-gate of devices 601 and 603, that is, the floating-gate of 611 is connected to the $V_y^+$ of devices 601 and 603. Similarly, the floating-gate of device 614 is connected to the $V_y^-$ of input gate of devices 602 and 604. These $V_y^+$ and $V_y^-$ inputs 630, 631, 632 and 633 of the MFMOS devices 601–604 are denoted as the secondary floating-gates which are connected to the floating-gate of the EEPROM and also overlap the primary floating-gates 634, 635, 636 and 637 of their respective MFMOS device. The important feature of this embodiment in FIG. 24, in contrast to the previous embodiment in FIG. 23, is that the amount of input coupling voltage at $V_y^+$ due to charge $Q_A$ on the floating-gate of EEPROM device 611 is determined by the coupling capacitance between the input-gates and the floating-gates of 601 and 603. This coupling capacitance is determined by the input gate area over the floating-gate and can be determined to a good degree of relative accuracy by design. Hence, charge $Q_A$ would present equal input coupling voltage into 601 and 603. Similarly, a charge $Q_B$ in the floating-gate of device 614 would present equal input coupling voltage into 602 and 604. The differential output current $I_0$ is given by $$I_0 = I_0^+ - I_0^- = K_6 V_x (Q_A - Q_B)$$

representing a four quadrant multiplication.

In programming cell 605, the select line is set high, VCont1 is set to the programming voltage $V_{pp}$ and $V_{p1}$ is set to $V_{SS}$. Furthermore, $VX^-$ and $V_{bias}$ are raised to $V_{pp}$ to facilitate Fowler-Nordheim tunnelling of electrons from the drain of 611 into its floating-gate. The erasure procedure for device 611 requires the select line to go high and $V_{p1}$ to be set to $V_{pp}$ and Vcont1, $V_x^-$ and Vbias to be grounded. $V_x^+$ and the source $V_{s1}$ of the EEPROM devices 611 and 614 should be floated during programming and erasing. For normal operation, the source $V_{s1}$ should be grounded. The conditions for programming or erasing the floating-gate of device 614 can be obtained by interchanging the programming/erasing voltage requirements of $V_{cont1}$, $V_{p1}$ with those of $V_{cont2}$, $V_{p2}$ respectively. The table below summarises the programming/erasure conditions for the synaptic cell illustrated in FIG. 24.

| F-G of 611 | $V_{bias}$ | $V_x^+$ | $V_x^-$ | $V_{sel1}$ | $V_{cont1}$ | $V_{cont2}$ | $V_{P1}$ | $V_{P2}$ |
|---|---|---|---|---|---|---|---|---|
| Programming | $V_{pp}$ | float | 0 | $V_{pp}$ | $V_{pp}$ | 0 | $V_{ss}$ | 0 |
| Adj. cell (horizontal) | 0 | " | 0 | $V_{ss}$ | $V_{pp}$ | 0 | $V_{ss}$ | 0 |
| Adj. cel (vertical) | $V_{pp}$ | " | 0 | $V_{pp}$ | 0 | 0 | 0 | 0 |
| Erasure | 0 | " | 0 | $V_{pp}$ | 0 | 0 | $V_{pp}$ | 0 |
| Adj. cell (horizontal) | 0 | " | 0 | $V_{ss}$ | 0 | 0 | $V_{pp}$ | 0 |
| Adj. cell (vertical) | 0 | " | 0 | $V_{pp}$ | 0 | 0 | 0 | 0 |
| Normal operation | $V_{cc}$–$V_{ss}$ | $V_{cc}$–$V_{ss}$ | 0 | $V_{cc}$ | 0 | 0 | — | — |

FIG. 25 represents an analog neural network comprising a column of synaptic cells similar to those of FIG. 6. The outputs are connected to a common summing line 710 and 711 feeding into a differential summer. The output feeds into a sigmoid activation function generator.

FIG. 26 shows a third embodiment of a neural synapse cell employing the MFMOS analog multiplier concept. As it can be seen, the third input (secondary floating-gate of the MFMOS devices of 801 and 803 are connected together to the tunnelling structure 811 and the third input (secondary floating-gate) of the MFMOS devices of 802 and 804 are also connected together to the tunnelling structure 812. This is denoted by nodes $V_y^+$ and $V_y^-$ respectively in FIG. 26. It should be noted that nodes $V_y^+$ and $V_y^-$ have been denoted as secondary floating-gates in discussions related to embodiments in FIGS. 24 and 25. The difference in charge between nodes $V_y^+$ and $V_y^-$, which is injected into or out of these floating third input gates by way of the two special thin tunnelling structures 811 and 812, determine the weight or strength of the synaptic connection. For programming the third input of the MFMOS devices 801 and 803, $V_x^-$ and $V_{bias}$ are set to the programming voltage $V_{pp}$, whilst $V_{p1}$ and $V_{p2}$ are connected to the $V_{SS}$ and $V_{CC}$ respectively with devices 805 and 806 selected. In this manner it would ensure the maximum voltage across thin tunnelling structure 811 to inject electrons into third input of floating-gate devices 801 and 803, and a small voltage across the other thin tunnelling structure 812 for a negligible disturbance on the initial charge in the third input of floating-gate devices 802 and 804. For the erasure procedure, the source of the device 805 is brought up to $V_{pp}$, through the line $V_{p1}$ with device 805 selected, whilst all other lines $V_{p2}$, $V_x^-$, $V_{bias}$ are set to ground. The table below summarises the simulation results for programming and erasing.

| 05/807/811 | $V_{bias}$ | $V_x^+$ | $V_x^-$ | $V_{sel1}$ | $\overline{V_{sel1}}$ | $V_{P1}$ | $V_{p2}$ |
|---|---|---|---|---|---|---|---|
| Programming | $V_{pp}$ | float | $V_{pp}$ | $V_{pp}$ | $V_{ss}$ | $V_{ss}$ | $V_{cc}$ |
| Adj. cell (vertical) | $V_{pp}$ | " | 0 | $V_{ss}$ | $V_{pp}$ | $V_{ss}$ | $V_{cc}$ |
| Adj. cell (horizontal) | 0 | " | $V_{pp}$ | $V_{pp}$ | $V_{ss}$ | 0 | 0 |
| Erasing | $V_{cc}$ | " | 0 | $V_{pp}$ | $V_{ss}$ | $V_{pp}$ | 0 |
| Adj. cell (vertical) | $V_{cc}$ | " | 0 | $V_{ss}$ | $V_{pp}$ | $V_{pp}$ | 0 |
| Adj. cell (horizontal) | $V_{cc}$ | " | 0 | $V_{pp}$ | $V_{ss}$ | 0 | 0 |
| Normal operation | $V_{cc}$–$V_{ss}$ | $V_{cc}$–$V_{ss}$ | 0 | $V_{ss}$ | $V_{pp}$ | — | — |

It is important to note that for each synapse employing a single ended input and differential output MFMOS analog multiplier that during the normal operation each $V_x^+$ is connected to the output of another neuron. This same output could be connected to the inputs of other neurons. Under normal operating conditions, $V_x^-$ is grounded for single ended input configuration and $V_{bias}$ is to Vcc or ground. During programming and erasing, $V_x^+$ is floated by isolating from the input line and/or the output of a neuron. This can be achieved by a pass transistor at the output of each neuron.

Another possible embodiment to that illustrated in FIG. 23, FIG. 24 and FIG. 26 is to replace the existing 3 input-gate floating-gate devices of the multiplier by 4 or more input-gate floating-gate devices to facilitate summing multiplication (as described in FIG. 22) such that two inputs can be summed and multiplied by the same neural weight. One of these inputs could be a preconditioned feedback signal from the output of the neuron.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

We claim:

1. An analog multiplier circuit comprising:
    four Multiple-input Floating-gate MOS (MFMOS) transistors connected in a common source configuration wherein:
        said transistors are grouped as a first pair of transistors and a second pair of transistors, each transistor having a drain, and the transistors of each pair having their drains connected together and connected to a voltage supply via a load;
        an output of the multiplier circuit is defined as the difference in voltage between the respective common drain connections of the first pair and the second pair of transistors; and
        each transistor comprises first and second control gates for selectively receiving first and second input signals to be multiplied together in either a floating or single ended input configuration, said control gates being arranged to accept floating or non-floating differential inputs or single ended inputs.

2. The circuit of claim 1 wherein the common source connection of the common source configuration is connected to a current source.

3. The circuit of claim 1 further comprising a first input signal connected between the first control gates of the first pair of transistors and also connected between the first control gates of the second pair of transistors, and a second input signal, to be multiplied with the first input signal, connected with a first phase between the second control gates of the first pair of transistors and connected with a second phase, complementary to the first phase, between the second control gates of the second pair of transistors.

4. The circuit of claim 1 wherein all of the first and second control gates are floating with respect to one another in the absence of input signals.

5. The circuit of claim 3 wherein one of the first control gates and one of the second control gates in each transistor pair is connected to a signal reference point.

6. The circuit of claim 5 wherein the first input signal is connected between a common reference point and the second control gate of a first transistor in said first pair of transistors and the first input signal is also connected between the common reference point and the second control gate of a first transistor in said second pair of transistors, and the second input signal is connected between the common reference point and the first control gate of said first transistor in said first pair of transistors and the second input signal is also connected between the common reference point and the first control gate of a second transistor in said second pair of transistors, and the common reference point is connected to the first control gate and the second control gate of the second transistor in said first pair of transistors and the common reference point is also connected to the first control gate of the first transistor and the second control gate of the second transistor in said second pair of transistors.

7. The circuit of claim 1 wherein each of said transistors is implemented as a floating gate MOS device on a common substrate.

8. The circuit of claim 7 wherein the floating gates are in the form of a first polysilicon layer and the control gates are in the form of a second polysilicon layer.

9. The circuit of claim 8 wherein each of the transistors is formed with the respective floating gate located over a channel of the respective transistor and extending into a field region where it capacitively couples to the control gates.

10. The circuit of claim 7, wherein the first pair of transistors and the second pair of transistors are located such that the control gates of a first transistor of the first pair of transistors are adjacent to the control gates of a first transistor of the second pair of transistors, and the control gates of a second transistor of the first pair of transistors are adjacent to the control gates of a second transistor of the second pair of transistors.

11. An analog multiplier circuit comprising at least four Multiple-input Floating-gate MOS (MFMOS) transistors connected in a common source configuration as a four quadrant, square law multiplier wherein:

four of the at least four transistors are grouped as a first pair of transistors and a second pair of transistors, each MOS transistor having a drain, and the transistors of each pair having their drains connected together and connected to a voltage supply via a load;

the common source connection of the common source configuration is connected to a current source;

an output of the multiplier circuit is defined as the difference in voltage between the respective common drain connections of the first pair and the second pair of transistors; and the multiplier circuit has first and second input signals to be multiplied together connected to selected first and second control gates of each transistor so as to achieve either a floating or single ended input configuration arranged to accept floating or non-floating differential inputs or single ended inputs respectively; and the first input signal is connected between the first control gates of the first pair of transistors and also connected between the first control gates of the second pair of transistors, and the second input signal, to be multiplied with the first input signal, is connected with a first phase between the second control gates of the first pair of transistors and connected with a second phase, complementary to the first phase, between the second control gates of the second pair of transistors.

12. The circuit of claim 11 wherein all of the first and second control gates are floating with respect to one another in the absence of input signals.

13. The circuit of claim 11 wherein in each pair of transistors one of the first control gates and one of the second control gates is connected to a signal reference point.

14. The circuit of claim 13 wherein the first input signal is connected between a reference potential at a common reference point and the second control gate of a first transistor in said first pair of transistors and the first input signal is also connected between the common reference point and the second control gate of a first transistor in said second pair of transistors, and the second input signal is connected between the common reference point and the first control gate of said first transistor in said first pair of transistors and the second input signal is also connected between the common reference point and the first control gate of a second transistor in said second pair of transistors, and the common reference point is connected to the first control gate and the second control gate of the second transistor in said first pair of transistors and the common reference point is also connected to the first control gate of the first transistor and the second control gate of the second transistor in said second pair of transistors.

15. The circuit of claim 11 wherein each of said transistors is implemented as a floating gate MOS device on a common substrate.

16. The circuit of claim 15 wherein the floating gates are in the form of a first polysilicon layer and the control gates are in the form of a second polysilicon layer.

17. The circuit of claim 16 wherein each of the at least four transistors is formed with the respective floating gate located over a channel of the respective transistor, the floating gate extending into a field region where it capacitively couples to the control gates.

18. The circuit of claim 15 wherein the first pair of transistors and the second pair of transistors are located such that the control gates of a first transistor of the first pair of transistors are adjacent to the control gates of a first transistor of the second pair of transistors, and the control gates of a second transistor of the first pair of transistors are adjacent to the control gates of a second transistor of the second pair of transistors.

19. A programmable synaptic cell including a four quadrant multiplier structure and weighting means for applying a weight to said four quadrant multiplier structure, the four quadrant multiplier structure comprising four Multiple-input Floating-gate MOS (MFMOS) transistors connected in a common source configuration as a four quadrant, square law multiplier wherein:

said transistors are grouped as a first pair of transistors and a second pair of transistors, each transistor having a drain, and the transistors of each pair having their drains connected together and connected to a voltage supply via a load;

the common source connection of the common source configuration is connected to a current source;

an output of the multiplier circuit is defined as the difference in voltage between the respective common drain connections of the first pair and the second pair of transistors; and the multiplier circuit has first and second input signals to be multiplied together connected to selected first and second control gates of each transistor so as to achieve either a floating or single ended input configuration arranged to accept floating or non-floating differential inputs or single ended inputs respectively; and the weighting means includes a weighting signal source for applying a weighting signal as the first input signal to said four quadrant multiplier structure, the output of the multiplier circuit being proportional to the product of the weighting signal and the second input signal.

20. The programmable synaptic cell of claim 19 wherein each of the transistors comprises a primary floating gate and a secondary floating gate, the input signals being connected to the primary floating gate and the weighting means comprises the secondary floating gate of each of the transistors of the multiplier structure, each of the secondary floating gates storing a charge representing the weighting signal.

21. The programmable synaptic cell of claim 19 wherein each of the transistors includes a floating gate and the weighting means comprises the floating gate of each of the transistors, each of the floating gates storing a charge representing the weighting signal.

22. The programmable synaptic cell of claim 20 wherein the weighting means is connected to charging means which applies the charge to the secondary floating gate of each of the transistors.

23. The programmable synaptic cell of claim 22 wherein the charging means includes thin oxide tunneling structures configured as charge injection structures associated with each secondary floating gate.

* * * * *

UNITED STATES PATENT AND TRADEMARK OFFICE
CERTIFICATE OF CORRECTION

PATENT NO. : 5,864,255
DATED : January 26, 1999
INVENTOR(S) : Chee Yee Kwok; Hamid Reza Mehrvarz It is certified that error appears in the above-identified patent and that said Letters Patent is hereby corrected as shown below:

In the Drawings, FIG. 16, Sheet 16, replace "Vout in volys" with
-- Vout in volts --.
Column 1, lines 42,45, replace "Circuits." with -- Circuits, --
(both occurrences).
Column 2, lines 34,59, change "consist" to -- consists -- (both occurrences).
Column 2, line 37, change "a analog" to -- an analog --.
Column 5, lines 46,49, change "MFNIOS" to -- MFMOS -- (both occurrences).
Column 5, line 52, replace "drain:" with -- drain; --.
Column 5, line 54, replace "mismatch:" with -- mismatch; --.
Column 5, line 57, replace "mismatch:" with -- mismatch; --.
Column 5, line 59, replace "peak):" with -- peak); --.
Column 6, line 14, after "simulated" delete "of".
Column 6, line 15, change "KHZ" to -- kHz --.
Column 6, line 17, after "simulated" delete "of the".
Column 6, line 18, change "KHZ" to -- kHz-- (both occurrences).
Column 6, line 26, delete "and".
Column 6, line 28, replace "invention." with -- invention; --.
Column 6, lines 30,31, replace "transistor." with -- transistor; --.
Column 7, line 32, that portion of Equation (1) reading "$V_s$" should read
-- $-V_s$ --.
Column 9, line 3, that portion of the equation reading "$[(W_1V_x+W_3V_{Blues}$" should read -- $[(W_1V_x+W_3V_{bias}$ --.
Column 10, line 60, replace "two pairs transistor" with -- two pairs of transistors --.

UNITED STATES PATENT AND TRADEMARK OFFICE
CERTIFICATE OF CORRECTION

PATENT NO. : 5,864,255
DATED : January 26, 1999
INVENTOR(S) : Chee Yee Kwok; Hamid Reza Mehrvarz It is certified that error appears in the above-identified patent and that said Letters Patent is hereby corrected as shown below:

Column 14, line 48, change "ail" to -- all --.
Column 14, line 56, delete "rail".
Column 15, lines 1,3,4, change "Khz" to -- kHz -- (all occurrences).
Column 15, line 6, change "steps 1" to -- step 1 --.
Column 15, line 60, change "KHz" to -- kHz --.
Column 16, line 65, replace "$I_o^{31}$" with -- $I_o^-$ --.
Column 17, line 58, replace "voltage ," with -- voltage, --.
Column 19, line 10, replace "Vcont1" with -- $V_{cont1}$ --.
Column 19, line 11, replace "VX⁻" with -- $V_x^-$ --.
Column 19, line 15, replace "Vcont1" with -- $V_{cont1}$ --; and "Vbias" with -- $V_{bias}$ --.
Column 19, line 30, replace "Adj. cel" with -- Adj. cell --.
Column 20, line 25, replace "Vcc" with -- $V_{cc}$ --.

Signed and Sealed this

Seventeenth Day of April, 2001

*Attest:*

NICHOLAS P. GODICI

*Attesting Officer*      *Acting Director of the United States Patent and Trademark Office*